(12) United States Patent
Huang et al.

(10) Patent No.: US 10,700,663 B2
(45) Date of Patent: Jun. 30, 2020

(54) RESONATOR AND RELATED MANUFACTURING METHOD

(71) Applicants: Semiconductor Manufacturing International (Shanghai) Corporation, Shanghai (CN); NINGBO SEMICONDUCTOR INTERNATIONAL CORPORATION, Ningbo (CN)

(72) Inventors: Herb He Huang, Shanghai (CN); Clifford Ian Drowley, Shanghai (CN); Jiguang Zhu, Shanghai (CN); Haiting Li, Shanghai (CN)

(73) Assignees: Semiconductor Manufacturing International (Shanghai) Corporation, Shanghai (CN); NINGBO SEMICONDUCTOTR INTERNATIONAL CORPORATION, Ningbo (CN)

( * ) Notice: Subject to any disclaimer, the term of this patent is extended or adjusted under 35 U.S.C. 154(b) by 616 days.

(21) Appl. No.: 15/453,728

(22) Filed: Mar. 8, 2017

(65) Prior Publication Data
US 2017/0264265 A1    Sep. 14, 2017

(30) Foreign Application Priority Data
Mar. 10, 2016 (CN) .......................... 2016 1 0136349

(51) Int. Cl.
*H03H 9/17* (2006.01)
*H01L 41/09* (2006.01)
(Continued)

(52) U.S. Cl.
CPC ............. *H03H 9/171* (2013.01); *H01P 7/065* (2013.01); *H03H 3/02* (2013.01); *H03H 9/1035* (2013.01);
(Continued)

(58) Field of Classification Search
USPC ........................................ 310/340, 344, 348
See application file for complete search history.

(56) References Cited

U.S. PATENT DOCUMENTS 6,215,375 B1    4/2001  Larson et al.
6,635,519 B2    10/2003 Barber et al.
(Continued)

FOREIGN PATENT DOCUMENTS

| CN | 1751435 A | 3/2006 |
|---|---|---|
| CN | 101024481 A | 8/2007 |

(Continued)

OTHER PUBLICATIONS

EP Search Report corresponding to European Patent Application No. 17158751.2, dated Aug. 1, 2017, 9 pages.

*Primary Examiner* — Thomas M Dougherty
(74) *Attorney, Agent, or Firm* — Anova Law Group, PLLC

(57) ABSTRACT

A resonator may include a first dielectric member, a second dielectric member, and a composite member. The first dielectric member may have a first cavity. The composite member may include a piezoelectric layer and may overlap at least one of the first dielectric member and the second dielectric member. At least one of the second dielectric member and the composite member may have a second cavity. The piezoelectric layer may be positioned between the first cavity and the second cavity. A projection of the first cavity in a direction perpendicular to a flat side of the first dielectric member and a projection of the second cavity in the direction may intersect each other to form a polygon. No two edges of the polygon may be parallel to each other.

20 Claims, 14 Drawing Sheets

(51) Int. Cl.
  *H01P 7/06* (2006.01)
  *H03H 9/56* (2006.01)
  *H03H 9/10* (2006.01)
  *H03H 3/02* (2006.01)

(52) U.S. Cl.
  CPC ............ *H03H 9/173* (2013.01); *H03H 9/564* (2013.01); *H03H 2003/023* (2013.01)

(56) References Cited

U.S. PATENT DOCUMENTS

| | | | | |
|---|---|---|---|---|
| 2006/0006768 | A1* | 1/2006 | Ishii | H03H 3/02 |
| | | | | 310/344 |
| 2017/0264263 | A1* | 9/2017 | Huang | H01L 27/20 |
| 2017/0264264 | A1* | 9/2017 | Huang | H01L 27/20 |

FOREIGN PATENT DOCUMENTS

| | | |
|---|---|---|
| CN | 103560763 A | 2/2014 |
| EP | 1041717 | 10/2000 |
| EP | 1041717 B1 | 12/2006 |
| JP | 106310973 A | 11/1994 |
| JP | 2003309445 | 10/2003 |
| JP | 2007142372 | 6/2007 |

\* cited by examiner

S201 Providing a preliminary substrate; providing a front-end device and an isolation member on the preliminary substrate; providing a first dielectric layer on the front-end device and the isolation member; providing an electrical conductor in the first dielectric layer, wherein the electrical conductor may directly contact the front-end device; providing an first electrode and a first interconnect structure on the first dielectric layer, wherein the first interconnect structure may directly contact the electrical conductor; providing a first dielectric member on the first electrode, the first dielectric layer, and the electrical conductor, wherein a portion of the first dielectric member may electrically insulate the first interconnect structure from the first electrode.

S202 Forming a first cavity in the first dielectric member, wherein a plan view of the first cavity may have a polygon shape that has a pair of parallel sides.

S203 Bonding the first dielectric member with a first substrate using a first bonding layer.

S204 Removing the preliminary substrate; providing a second dielectric layer on the isolation member and the front-end device.

S205 Etching the second dielectric layer, the isolation member, and the first dielectric layer to form an opening.

S206 Providing a piezoelectric layer on the second dielectric layer and in the opening; providing an second electrode on the piezoelectric layer.

S207 Partially removing portions of the second electrode and the piezoelectric layer that are positioned outside the opening.

S208 Providing a second cavity in the opening; sealing the second cavity.

FIG. 2

RESONATOR AND RELATED MANUFACTURING METHOD

CROSS-REFERENCE TO RELATED APPLICATION

This application claims priority to and benefit of Chinese Patent Application No. 201610136349.7, filed on 10 Mar. 2016; the Chinese Patent Application is incorporated herein by reference in its entirety.

BACKGROUND

The technical field is related to a resonator, e.g., a film bulk acoustic resonator (FBAR), and a method for manufacturing the resonator.

A resonator, such as a film bulk acoustic resonator (FBAR), may be used for radio frequency (RF) filtering or pressure sensing. A resonator may include a piezoelectric film. The piezoelectric film may have a through hole that is resulted from the manufacturing process of the resonator. The through hole may negatively affect the performance of the resonator.

SUMMARY

An embodiment may be related to a resonator, e.g., a film bulk acoustic resonator (FBAR). The resonator may include a first dielectric member, a second dielectric member, and a composite member. The first dielectric member may have a first cavity. The composite member may include a piezoelectric layer and may overlap at least one of the first dielectric member and the second dielectric member. At least one of the second dielectric member and the composite member may have a second cavity. The piezoelectric layer may be positioned between the first cavity and the second cavity.

A projection of the first cavity in a direction perpendicular to a flat side (e.g., bottom side) of the first dielectric member and a projection of the second cavity in the direction may intersect each other to form a polygon with a finite number of edges, e.g., with 3, 4, 5, or 6 edges. At least two edges of the polygon are sections of at least two sides of the projection of the first cavity. Two or more edges of the polygon are sections of two or more sides of the projection of the second cavity. No two edges of the polygon may be parallel to each other. All edges of the polygon may extend not parallel to one another.

The projection of the first cavity may have a first side, a second side, a third side, and a fourth side, each of the sides being substantially straight and corresponding to a substantially flat sidewall of the first cavity. The first side may be parallel to the second side. Two ends of the first side may respectively directly contact an end of the third side and an end of the fourth side. The projection of the second cavity may have a fifth side, which is substantially straight and corresponds to a substantially flat sidewall of the second cavity. The fifth side may intersect both the third side and the fourth side.

The projection of the second cavity may have a sixth side and a seventh side, each of the sides being substantially straight and corresponding to a substantially flat sidewall of the second cavity. The sixth side may be parallel to the seventh side. Two ends of the fifth side may respectively directly contact an end of the sixth side and an end of the seventh side.

An embodiment may be related to a resonator. The resonator may include a first dielectric member, a second dielectric member, and a composite member. The first dielectric member may have a first cavity. A projection of the first cavity in a direction perpendicular to a flat side of the first dielectric member may have a first side, a second side, a third side, and a fourth side, each of the sides being straight. The first side may be parallel to the second side. Two ends of the first side may respectively directly contact an end of the third side directly and an end of the fourth side. The third side may not be parallel to the fourth side. The composite member may have a piezoelectric layer and may overlap at least one of the first dielectric member and the second dielectric member. At least one of the second dielectric member and the composite member may have a second cavity. The piezoelectric layer may be positioned between the first cavity and the second cavity.

A section of the composite member may extend from a first sidewall of the first cavity to a second sidewall of the first cavity and may have no through holes, each of the first sidewall and the second sidewall being substantially flat. The first sidewall of the first cavity and the second sidewall of the first cavity respectively may correspond to the first side and the second side or may respectively correspond to the third side and the fourth side.

A projection of the second cavity in the direction may have a fifth side, a sixth side, a seventh side, and an eighth side, each of the sides being straight. The fifth side may be parallel to the sixth side. An end of the seventh side may directly contact an end of the fifth side. The seventh side may not be parallel to the eighth side. None of the first side, the second side, the third side, and the fourth side may be parallel to any of the fifth side, the sixth side, the seventh side, and the eighth side. The fifth side may be parallel to the sixth side. A first end of the seventh side may directly contact an end of the fifth side. A second end of the seventh side may directly contact a first end of the eighth side. A second end of the eighth side may directly contact an end of the sixth side.

The first side may intersect both the seventh side and the eighth side. The third side may interest the seventh side. The fourth side may interest the eighth side.

The projection of the second cavity may have a ninth side. The ninth side may intersect both the third side and the fourth side.

The composite member may have an electrode. The electrode may overlap the piezoelectric layer and may have the second cavity.

The second cavity may be positioned between two opposite portions of the electrode. The two opposite portions of the electrode may be spaced from each other by the second cavity in a cross-sectional view of the resonator and may define two straight sides of a projection of the second cavity in the direction.

The two opposite portions of the electrode may be positioned between two opposite portions of the piezoelectric layer and may respectively directly contact the two opposite portions of the piezoelectric layer. The two opposite portions of the piezoelectric layer may be separated from each other by at least the electrode in the cross-sectional view of the resonator.

The resonator may include an adhesive layer. The two opposite portions of the piezoelectric layer may be positioned between two opposite portions of the adhesive layer and may respectively directly contact the two opposite portions of the adhesive layer. The two opposite portions of the adhesive layer may be separated from each other by at least the piezoelectric layer in the cross-sectional view of the resonator.

The resonator of claim 16 may include an insulating layer, which may be different each of the first dielectric member and the second dielectric member. The two opposite portions of the adhesive layer may be positioned between two opposite portions of the insulating layer and may respectively directly contact the two opposite portions of the insulating layer. The two opposite portions of the insulating layer may be separated from each other by at least the adhesive layer in the cross-sectional view of the resonator.

The resonator may include a cover member. The cover member may cover (and seal) the second cavity, may directly contacts the two opposite portions of the electrode, and may be positioned between the electrode and a portion of the second dielectric member.

A flat portion of the electrode may be positioned between the second cavity and the piezoelectric layer, may be position between the two opposite portions of the electrode, and may be oriented at an angle between 0 degree and 180 degrees with respect to at least one of the two opposite portions of the electrode.

An embodiment may be related to a method for manufacturing a resonator. The method may include the following steps: providing a first dielectric member, which may have a first cavity; providing a second dielectric member; and providing a composite member, which may have a piezoelectric layer and may overlap at least one of the first dielectric member and the second dielectric member. At least one of the second dielectric member and the composite member may have a second cavity. The piezoelectric layer may be positioned between the first cavity and the second cavity. A projection of the first cavity in a direction perpendicular to a flat side of the first dielectric member and a projection of the second cavity in the direction may intersect each other to form a polygon. No two edges of the polygon may be parallel to each other.

An embodiment may be related to an electronic device. The electronic device may include an electronic component and a resonator electrically connected to the electronic component. The resonator may have one or more of the above-described features.

According to embodiments, a resonator may include a continuous composite member that includes a piezoelectric film. The composite member may substantially (and/or completely) separate two cavities of the resonator and may substantially (and/or completely) seal the two cavities of the resonator. Advantageously, satisfactory performance of the resonator may be attained.

According to embodiments, in a resonator, a composite member with a piezoelectric layer is positioned between two cavities, a common region of the two cavities at the composite member may be a polygon, and no two edges (i.e., no two straight sides) of the polygon may be parallel to each other. Advantageously, unwanted reflection and/or unwanted resonance of acoustic waves generated in the composite member may be minimized or substantially prevented, and satisfactory performance of the resonator may be attained.

According to embodiments, in a resonator, a composite member with a piezoelectric layer is positioned between a first cavity and a second cavity, sidewalls of the first cavity may be defined by a first material (e.g., a dielectric material), and sidewalls of the second cavity may be defined by a second material (e.g., a conductive material or a semiconductor material) different from the first material. Advantageously, unwanted reflection and/or unwanted resonance of acoustic waves generated in the composite member may be minimized or substantially prevented, and satisfactory performance of the resonator may be attained.

The above summary is related to some of many embodiments disclosed herein and is not intended to limit the scope of embodiments.

BRIEF DESCRIPTION OF THE DRAWINGS

FIG. 2 shows a flowchart that illustrates steps in one or more methods for manufacturing one or more resonators in accordance with one or more embodiments.

DETAILED DESCRIPTION

Figure 1A:
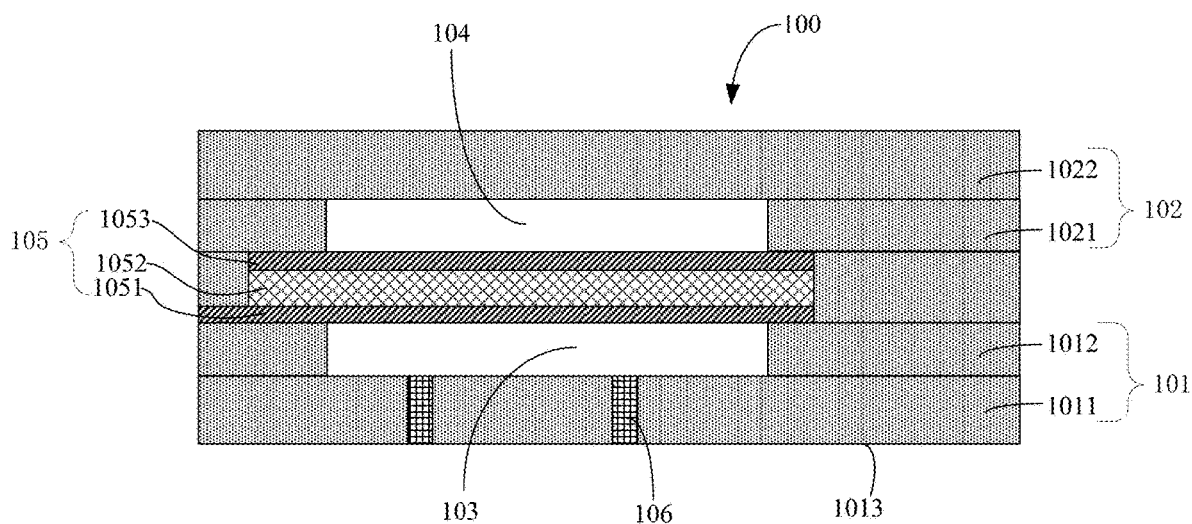
FIG. 1A shows a schematic diagram (e.g., a schematic cross-sectional view) that illustrates elements and/or structures in a resonator, e.g., a film bulk acoustic resonator (FBAR), in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 1B:
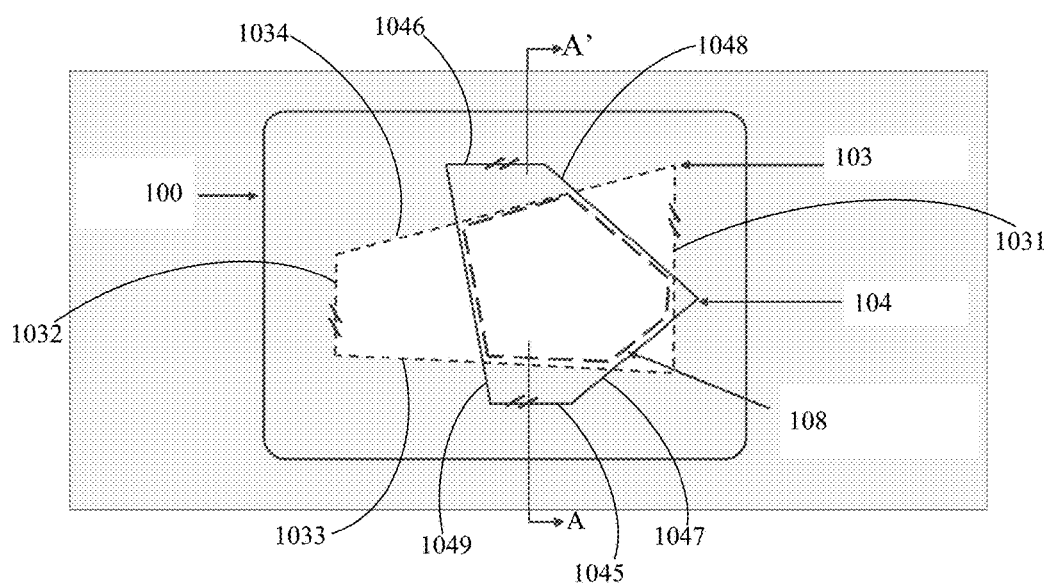
FIG. 1B shows a schematic diagram (e.g., a plan view) that illustrates elements and/or structures in a resonator in accordance with one or more embodiments.

FIG. 1A shows a schematic diagram (e.g., a schematic cross-sectional view) that illustrates elements and/or structures in a resonator 100, e.g., a film bulk acoustic resonator (FBAR), in accordance with one or more embodiments. FIG. 1B shows a schematic diagram (e.g., a plan view) that illustrates elements and/or structures in the resonator 100 in accordance with one or more embodiments. FIG. 1A may represent a schematic cross-sectional view taken along a line A-A' indicated in FIG. 1B. The resonator 100 may include a dielectric member 101, a dielectric member 102, and a composite member 105.

The dielectric member 101 may include a dielectric layer 1011 and a dielectric layer 1012 and may have a cavity 103. The cavity 103 may extend from one side of the dielectric layer 1012 to another side of the dielectric layer 1012 and may be sealed by the dielectric layer 1011. The dielectric member 101, the dielectric layer 1011, and/or the dielectric layer 1012 may be formed of a silicon oxide material and/or a silicon nitride material, such as one or more of silicon dioxide ($SiO_2$), fluorocarbons ($CF_3$), carbon doped silicon oxide (SiOC), silicon nitride (SiN), and silicon carbonitride (SiCN). The dielectric member 101, the dielectric layer 1011, and/or the dielectric layer 1012 may include a fluorocarbon (CF) film formed on a SiCN film and may primarily include fluorocarbon fluorine (F) and carbon (C). The CF film may be an amorphous (non-crystalline) CF film.

The dielectric layer 1011 may have one or more through holes connected to the cavity 103; one or more sealers 106 may be positioned inside the one or more through holes of the dielectric layer 1011 and may seal the one or more through holes. The quantity of through holes in the dielectric layer 1011 and the quantity of corresponding sealers 106 may be determined according to particular embodiments. The one or more sealers 106 may be formed of silicon dioxide. One or more materials of the one or more sealers 106 may be identical to one or more materials of the dielectric member 101, the dielectric layer 1011, and/or the dielectric layer 1012.

The dielectric member 102 may include a dielectric layer 1021 and a dielectric layer 1022 and may have a cavity 104. The cavity 104 may extend from one side of the dielectric layer 1021 to another side of the dielectric layer 1021 and may be sealed by the dielectric layer 1022. The composite member 105 may overlap at least one of the dielectric member 101 and the dielectric member 102, may be positioned between the dielectric member 101 and the dielectric member 102, and may be positioned between the cavity 103 and the cavity 104. One or more materials of the dielectric member 102, the dielectric layer 1021, and/or the dielectric layer 1022 may be identical to one or more materials of the dielectric member 101, the dielectric layer 1011, and/or the dielectric layer 1012.

The dielectric layer 1022 may have one or more through holes connected to the cavity 104; one or more sealers may be positioned inside the one or more through holes of the dielectric layer 1022 and may seal the one or more through holes.

The composite member 105 may include a piezoelectric layer 1052, an electrode 1051, and an electrode 1053. The piezoelectric layer 1052 may be positioned between the cavity 103 and the cavity 104 and may be positioned between the electrode 1051 and the electrode 1053. The composite member 105 may be continuous in a direction parallel to the side 1013 of the dielectric member 101 and may have no structure that causes substantial discontinuity in the direction parallel to the side 1013 of the dielectric member 101.

The piezoelectric layer 1052 may be formed of at least one piezoelectric material, such as at least one of ZnO, AlN, and GaN. The piezoelectric layer 1052 may be formed of material that has a wurtzite crystal structure. The piezoelectric layer 1052 may be formed of AlN. A thickness of the piezoelectric film 1043 may be configured according to a target resonance frequency associated with the resonator 100. The thickness of the piezoelectric film 1043 may be about ½ of the wavelength associated with the target resonance frequency.

The electrode 1051 may be positioned between the cavity 103 and the piezoelectric layer 1052. A section of the electrode 1051 may extend from the first sidewall of the cavity 103 to the second sidewall of the cavity 103 and may have no through holes. The electrode 1051 may be formed of at least one semiconductor material and/or at least one metal material. The electrode 1051 may be formed of one or more of Si, Ge, SiGe, SiC, SiGeC, etc. The electrode 1051 may be or may include a monocrystalline silicon (or single-crystal silicon) film. The electrode 1051 may be or may include one or more films formed of at least one of platinum (Pt), gold (Au), iridium (Ir), osmium (Os), rhenium (Re), palladium (Pd), rhodium (Rh), ruthenium (Ru), molybdenum (Mo), tungsten (W), etc. A thickness of the electrode 1051 may be configured according to a target resonance frequency associated with the resonator 100. The thickness of the electrode 1051 may be about 1/10 of the wavelength associated with the target resonance frequency.

The electrode 1053 may be positioned between the cavity 104 and the piezoelectric layer 1052. A section of the electrode 1053 may continuously extend from the first sidewall of the cavity 104 to the second sidewall of the cavity 104 without having any through holes. The electrode 1053 may be formed of at least one semiconductor material and/or at least one metal material. The electrode 1053 may be formed of one or more of Si, Ge, SiGe, SiC, SiGeC, etc. The electrode 1053 may be or may include a monocrystalline silicon (or single-crystal silicon) film. The electrode 1053 may be or may include one or more films formed of at least one of platinum (Pt), gold (Au), iridium (Ir), osmium (Os), rhenium (Re), palladium (Pd), rhodium (Rh), ruthenium (Ru), molybdenum (Mo), tungsten (W), etc. A thickness of the electrode 1053 may be configured according to a target resonance frequency associated with the resonator 100. The thickness of the electrode 1053 may be about 1/10 of the wavelength associated with the target resonance frequency.

The composite member 105 may include an electrical insulator positioned between the electrode 1051 and the piezoelectric layer 1052 (and may directly contact at least one of the electrode 1051 and the piezoelectric layer 1052). The electrode 1051 may be positioned between the cavity 103 and the electrical insulator. The electrical insulator may be formed of one or more inorganic materials. The electrical insulator may be or may include at least one of a silicon oxide layer, a silicon nitride layer, and a silicon oxynitride layer. The electrical insulator may be or may include a silicon oxide layer. The composite member 105 may include an adhesive layer (or glue layer) positioned between the electrode 1051 and the electrical insulator for reinforcing bonding between the electrode 1051 and the electrical insulator. The adhesive layer may be formed of a material that has a wurtzite crystal structure. The adhesive layer may be formed of molybdenum (Mo).

The composite member 105 may include an electrical insulator positioned between the electrode 1053 and the piezoelectric layer 1052 (and directly contacting at least one of the electrode 1053 and the piezoelectric layer 1052. The electrode 1053 may be positioned between the cavity 104 and the electrical insulator. The electrical insulator may be formed of one or more inorganic materials. The electrical insulator may be or may include at least one of a silicon oxide layer, a silicon nitride layer, and a silicon oxynitride layer. The electrical insulator may be or may include a silicon oxide layer. The composite member 105 may include an adhesive layer (or glue layer) positioned between the electrode 1053 and the electrical insulator for reinforcing bonding between the electrode 1053 and the electrical insulator. The adhesive layer may be formed of a material that has a wurtzite crystal structure. The adhesive layer may be formed of molybdenum (Mo).

The resonator 100 may include interconnect structures that are respectively electrically connected to the electrode 1051 and the electrode 1053.

A projection of the cavity 103 in a direction perpendicular to a flat side (e.g., a side 1013 and/or bottom side) of the dielectric member 101 and a projection of the cavity 104 in the direction may intersect each other to form a polygon 108, i.e., a polygonal joint periphery, with a finite number of edges. The projection of the cavity 103, the projection of the cavity 104, and the polygon 108 are illustrated in FIG. 1B. The polygon 108 may represent a common region of the cavities 103 and 104 at the composite member 105. At least two edges of (i.e., at least two straight sides) the polygon 108 are sections of at least two sides of the projection of the cavity 103. Two or more edges (i.e., two or more straight sides) of the polygon 108 are sections of two or more sides of the projection of the cavity 104. No two edges (i.e., no two straight sides) of the polygon 108 may be parallel to each other. All edges (i.e., all straight sides) of the polygon 108 may extend not parallel to one another. Advantageously, unwanted reflection and/or unwanted resonance of acoustic waves generated in the composite member 105 may be minimized or substantially prevented.

The projection of the cavity 103 may have a side 1031, a side 1032, a side 1033, and a side 1034, each of the sides being straight and corresponding to a substantially flat sidewall of the cavity 103. The side 1031 may be parallel to the side 1032. A substantially flat sidewall of the cavity 103 corresponding to the side 1031 may be substantially parallel to a substantially flat sidewall of the cavity 103 corresponding to the side 1032. The parallel structure may facilitate measurement and/or control in the manufacturing process of the resonator 100. Two ends of the side 1031 may respectively directly contact a first end of the side 1033 and a first end of the side 1034. Two ends of the side 1032 may respectively directly contact a second end of the side 1033 and a second end of the side 1034. The side 1033 may not be parallel to the side 1034

A projection of the cavity 104 in the direction perpendicular to the flat side (e.g., the side 1013) of the dielectric member 101 may have a side 1045, a side 1046, a side 1047, a side 1048, and a side 1049, each of the sides being straight and corresponding to a substantially flat sidewall of the cavity 103. The side 1045 may be parallel to the side 1046. A substantially flat sidewall of the cavity 104 corresponding to the side 1045 may be substantially parallel to a substantially flat sidewall of the cavity 104 corresponding to the side 1046. The parallel structure may facilitate measurement and/or control in the manufacturing process of the resonator 100. Two ends of the side 1049 may respectively directly contact an end of the side 1045 and an end of the side 1046. An end of the side 1047 may directly contact an end of the side 1045. The side 1047 may not be parallel to the side 1048. None of the side 1031, the side 1032, the side 1033, and the side 1034 may be parallel to any of the side 1045, the side 1046, the side 1047, the side 1048, and the side 1049 in the projections of the cavities 103 and 104 in the direction perpendicular to the flat side (e.g., the side 1013) if the dielectric member 101.

A first end of the side 1047 may directly contact an end of the side 1045. A second end of the side 1047 may directly contact a first end of the side 1048. A second end of the side 1048 may directly contact an end of the side 1046.

The side 1031 may intersect both the side 1047 and the side 1048. The side 1033 may interest both the side 1047 and the side 1049. The side 1034 may interest both the side 1048 and the side 1049. The side 1049 may intersect both the side 1033 and the side 1034.

A section of the composite member 105 may extend from a first sidewall of the cavity 103 (e.g., the left sidewall of the cavity 103 illustrated in FIG. 1A) to a second sidewall of the cavity 103 (e.g., the right sidewall of the cavity 104 illustrated in FIG. 1A) and may have no through holes. The first sidewall of the cavity 103 and the second sidewall of the cavity 103 may respectively correspond to two of the side 1031, the side 1032, the side 1033, and the side 1034. Each of the first sidewall of the cavity 103 and the second sidewall of the cavity 103 may be substantially perpendicular to the flat side (e.g., the side 1013) of the dielectric member 101.

According to embodiments, in the resonator 100, the composite member 105 (which includes the piezoelectric layer 1052 without through holes or interruptions) may substantially (and/or completely) separate the two cavities 103 and 104 and may substantially (and/or completely) seal the two cavities 103 and 104. Advantageously, satisfactory performance of the resonator 100 may be attained.

FIG. 2 shows a flowchart that illustrates steps in one or more methods for manufacturing one or more resonators in accordance with one or more embodiments. FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, and FIG. 27 show schematic diagrams (e.g., schematic cross-sectional views and schematic plan views/projections) that illustrate elements and/or structures formed in the one or more methods for manufacturing the one or more resonators in accordance with one or more embodiments.

Some features of the one or more resonators may be identical to or analogous to some features of the resonator 100 discussed with reference to FIG. 1A and FIG. 1B.

Figure 19:
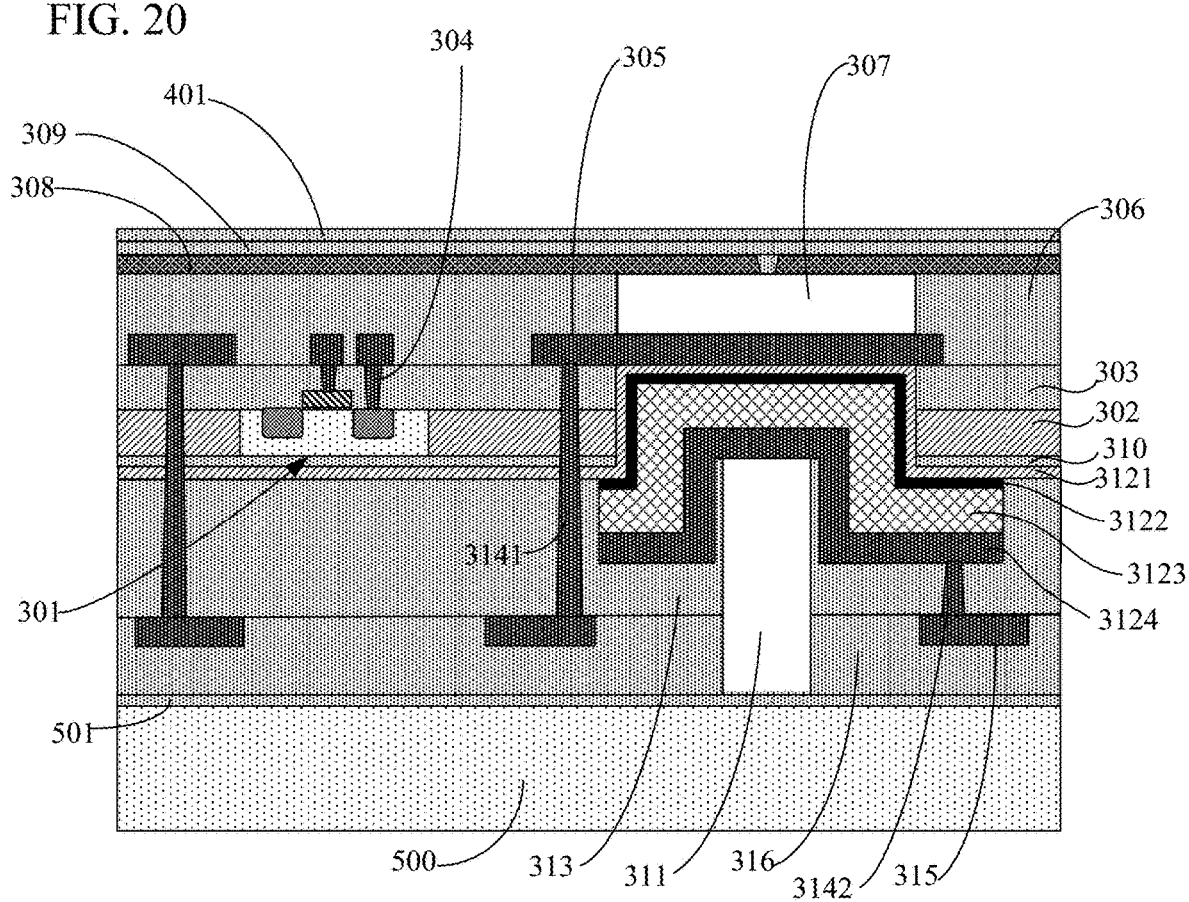
Figures 25, 26, 27:
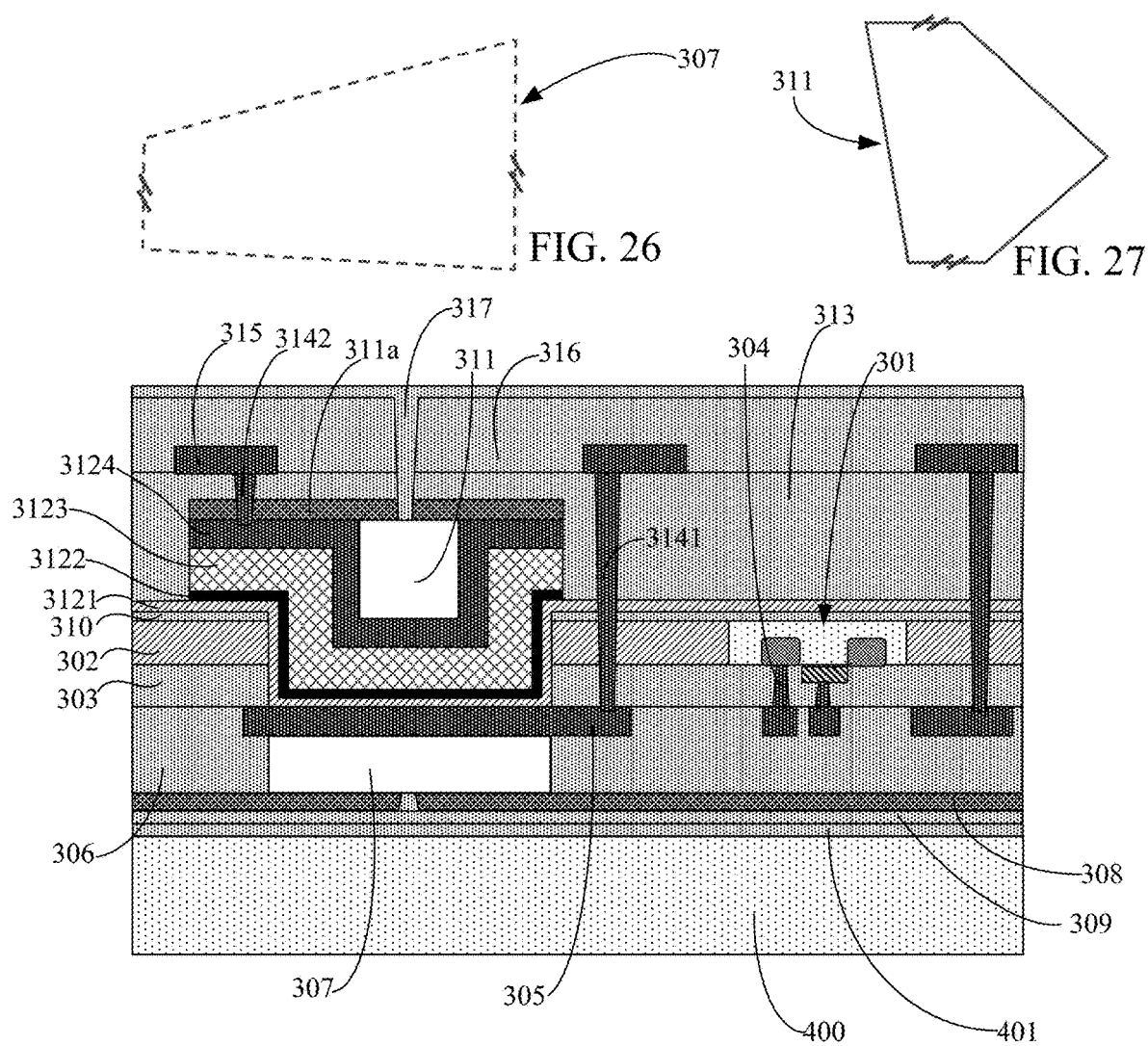

Referring to FIG. 19 and FIG. 25, a resonator may include one or more of the following elements: a bonding layer 401, a sealing member 309, a cover member 308, a dielectric layer 303, an isolation member 302 (e.g., a shallow trench isolation member), a front-end device 301 (e.g., a transistor), an electrical conductor 304, a dielectric layer 310, an insulating layer 3121, an adhesive layer 3122, a dielectric member 306, an electrode 305, an electrical conductor 3141, a dielectric member 313, a dielectric layer 316, an interconnect structure 315 (e.g., a metal structure), an electrical conductor 3142, a bonding layer 501, a substrate 500, a sealing member 317, a cover member 311a, a substrate 400, and a composite member. The composite member may include a piezoelectric layer 3123 and an electrode 3124.

The dielectric member 306 may have a cavity 307. The cavity 307 may partially expose the electrode 305. The composite member may overlap at least one of the dielectric member 306 and the dielectric member 313. At least one of the dielectric member 313 and the composite member may have a cavity 311. The piezoelectric layer 3123 may be positioned between the cavity 307 and the cavity 311. Some features of the cavities 307 and 311 may be identical to or analogous to some features of the cavities 103 and 104 discussed with reference to FIG. 1A and FIG. 1B.

Structures and relations associated with the cavities 307 and 311 may be identical to or analogous to structures and relations associated with the cavities 103 and 104 discussed with reference to FIG. 1A and FIG. 1B. Each of the cavity 307 and the cavity 311 may have at least one pair of parallel sidewalls. The parallel sidewalls may facilitate control and/or measurement in the manufacturing process of the resonator. Each of the sidewalls may be substantially flat. A projection of the cavity 307 in a direction perpendicular to a flat side (e.g., bottom side) of the dielectric member 306 and a projection of the cavity 311 in the direction may intersect each other to form a polygon, i.e., a polygonal joint periphery, with a finite number of edges. The polygon may represent a common region of the cavities 307 and 311 at the composite member. At least two edges of (i.e., at least two straight sides) the polygon are sections of at least two sides of the projection of the cavity 307. Two or more edges (i.e., two or more straight sides) of the polygon are sections of two or more sides of the projection of the cavity 311. No two edges of the polygon may be parallel to each other. All edges of the polygon may extend not parallel to one another. Advantageously, unwanted reflection and/or unwanted resonance of acoustic waves generated in the composite member may be minimized or substantially prevented.

The electrode 3124 may overlap the piezoelectric layer 3123. Referring to FIG. 19, the dielectric member 313 may have the cavity 311. Referring to FIG. 25, the electrode 3124 may have the cavity 311, and the composite member may have the cavity 311.

The piezoelectric layer 3122 may be formed of at least one piezoelectric material, such as at least one of ZnO, AlN, and GaN. The piezoelectric layer 3122 may be formed of material that has a wurtzite crystal structure. The piezoelectric layer 3122 may be formed of AlN. A thickness of the piezoelectric film 3122 may be configured according to a target resonance frequency associated with the resonator. The thickness of the piezoelectric film 3122 may be about ½ of the wavelength associated with the target resonance frequency.

The electrode 3124 may be formed of at least one semiconductor material and/or at least one metal material. The electrode 3124 may be formed of one or more of Si, Ge, SiGe, SiC, SiGeC, etc. The electrode 3124 may be or may include a monocrystalline silicon (or single-crystal silicon) film. The electrode 3124 may be or may include one or more films formed of at least one of platinum (Pt), gold (Au), iridium (Ir), osmium (Os), rhenium (Re), palladium (Pd), rhodium (Rh), ruthenium (Ru), molybdenum (Mo), tungsten (W), etc. A thickness of the electrode 3124 may be configured according to a target resonance frequency associated with the resonator 100. The thickness of the electrode 3124 may be about 1/10 of the wavelength associated with the target resonance frequency. An insulating layer and/or an isolation layer may be positioned between the electrode 3124 and the piezoelectric layer 3123.

The cavity 311 may be positioned between two opposite portions (e.g., illustrated left portion and right portion) of the electrode 3124. Referring to FIG. 25 and FIG. 27, the two opposite portions of the electrode 3124 may be spaced from each other by the cavity 311 in a cross-sectional view of the resonator and may define two straight sides of a projection of the cavity 311 in a direction perpendicular to a flat surface of the dielectric member 306.

The two opposite portions of the electrode 3124 may be positioned between two opposite portions (e.g., illustrated left portion and right portion) of the piezoelectric layer 3123 and may respectively directly contact the two opposite portions of the piezoelectric layer 3123. The two opposite portions of the piezoelectric layer 3123 may be separated from each other by at least the electrode 3124 in the cross-sectional view of the resonator.

The two opposite portions of the piezoelectric layer 3123 may be positioned between two opposite portions of the adhesive layer 3122 and may respectively directly contact the two opposite portions of the adhesive layer 3122. The two opposite portions of the adhesive layer 3122 may be separated from each other by at least the piezoelectric layer 3123 in the cross-sectional view of the resonator. The adhesive layer 3122 may be formed of a material that has a wurtzite crystal structure. The adhesive layer 3122 may be formed of molybdenum (Mo). The adhesive layer 3122 may enable sufficient bonding between the piezoelectric layer 3123 and the electrode 305.

The two opposite portions of the adhesive layer 3122 may be positioned between two opposite portions of the insulating layer 3121 and may respectively directly contact the two opposite portions of the insulating layer 3121. The two opposite portions of the insulating layer 3121 may be separated from each other by at least the adhesive layer 3122 in the cross-sectional view of the resonator. The insulating layer 3121 may directly contact each of the adhesive layer 3122, the dielectric layer 310, the isolation member 302, the dielectric layer 303, and the electrode 305 and may cover the front-end device 301. The insulating layer 3121 may be formed of one or more inorganic materials. The insulating layer 3121 may be or may include at least one of a silicon oxide layer, a silicon nitride layer, and a silicon oxynitride layer. The insulating layer 3121 may be or may include a silicon oxide layer.

One or more of the electrode 305, the insulating layer 3121, the adhesive layer 3122, the piezoelectric layer 3123, the electrode 3124, etc. may constitute the composite member of the resonator.

The cover member 311*a* may cover (and seal) the cavity 311, may directly contacts the two opposite portions of the electrode 3124, and may be positioned between the electrode 3124 and a portion of the dielectric member 313.

A flat portion (e.g., top portion illustrated in FIG. 19 or bottom portion illustrated in FIG. 25) of the electrode 3124 may be positioned between the cavity 311 and the piezoelectric layer 3123, may be position between the two opposite portions of the electrode 3124, and may be oriented at an angle between 0 degree and 180 degrees with respect to at least one of the two opposite portions of the electrode 3124. For example, the angle may be substantially 90 degrees.

The dielectric member 313 may cover the cover member 311*a* and may directly contact one or more of the cover member 311*a*, the electrode 3124, the piezoelectric layer 3123, the adhesive layer 3122, the insulating layer 3121, etc. The cover member 308 may be formed of a dielectric material, such as one or more of an oxide material, a nitride material, an oxynitride material, a carbide material, etc. The cover member 311*a* may be formed of one or more of a silicon oxide material, a silicon nitride material, a silicon oxynitride material, a silicon carbide material, etc.

The dielectric layer 316 may directly contact the dielectric member 313 and may cover the interconnect structure 315. The interconnect structure 315 may be positioned on the dielectric member 313 and may be electrically connected to the electrode 3124 through the electrical conductor 3142.

The bonding layer 501 may be formed of a silicon oxide material and may bond with the dielectric layer 316 through fusion bonding.

Referring to FIG. 19, the bonding layer 501 may directly contact each of the dielectric layer 316 and the substrate 500 and may bond the dielectric layer 316 with the substrate 500. The substrate 500 may provide structural support in the resonator. The substrate 500 may be formed of one or more of a semiconductor material (e.g., silicon), a ceramic material (e.g., alumina), a quartz material, a glass material, a metal material, an insulating material, etc.

Referring to FIG. 25, the sealing member 317 may directly contact the dielectric layer and may seal one or more through holes of the dielectric layer 316, the dielectric member 313, and the cover member 311*a*. One or more materials of the sealing member 317 may be identical to one or more materials of one or more of the elements 306, 303, 302, 310, 313, 316, etc. The sealing member 309 may be formed of silicon dioxide ($SiO_2$).

The dielectric layer 303 may be positioned between the isolation member 302 and the dielectric member 306 and may be positioned between the isolation member 302 and the electrode 305. The electrical conductor 3141 may extend through the elements 313, 3121, 310, 302, and 303 and may directly contact the electrode 305. The electrode 305 may be separated from an interconnect structure that is positioned on the dielectric layer 303 by a portion of the dielectric member 306. The front-end device 301 may be electrically connected through the electrical conductor 304 to the interconnect structure that is positioned on the dielectric layer 303 and may be positioned between two portions of the isolation member 302.

The isolation member 302 may be formed of at least one of silicon oxide, silicon nitride, silicon oxynitride, etc.

One or more of the dielectric member 306, the dielectric layer 303, the dielectric layer 310, the dielectric layer 316, and the dielectric member 313 may be formed of one or more of a silicon oxide material, a silicon nitride material, silicon dioxide ($SiO_2$), fluorocarbon (CF), carbon-doped silicon oxide (SiOC), silicon nitride (SiN), and silicon carbonitride (SiCN). The dielectric layer 102 and/or the dielectric layer 101 may include a SiCN film formed on a CF film. The CF film may be formed of an amorphous (non-crystalline) CF material.

The electrode 305 and/or the electrode 3124 may be formed of at least one semiconductor material and/or at least one metal material. The electrode 305 and/or the electrode 3124 may be formed of one or more of Si, Ge, SiGe, SiC, SiGeC, etc. The electrode 305 and/or the electrode 3124 may be or may include a monocrystalline silicon (or single-crystal silicon) film. The electrode 305 and/or the electrode 3124 may be or may include one or more films formed of at least one of platinum (Pt), gold (Au), iridium (Ir), osmium (Os), rhenium (Re), palladium (Pd), rhodium (Rh), ruthenium (Ru), molybdenum (Mo), tungsten (W), etc. A thickness of the electrode 305 and/or a thickness of the electrode 3124 may be configured according to a target resonance frequency associated with the resonator 100. The thickness of the electrode 305 and/or the thickness of the electrode 3124 may be about 1/10 of the wavelength associated with the target resonance frequency.

The cover member 308 may directly contact the dielectric member 306 and may cover (and may seal) the cavity 307. The cover member 308 may be formed of a dielectric material, such as one or more of an oxide material, a nitride material, an oxynitride material, a carbide material, etc. The cover member 308 may be formed of one or more of a silicon oxide material, a silicon nitride material, a silicon oxynitride material, a silicon carbide material, etc.

The sealing member 309 may directly contact the cover member 308 and may seal one or more through holes of the cover member 308. One or more materials of the sealing member 309 may be identical to one or more materials of one or more of the elements 306, 303, 302, 310, 313, 316, 317, etc. The sealing member 309 may be formed of silicon dioxide ($SiO_2$).

The bonding layer 401 may directly contact each of the sealing member 309 and the substrate 400 and may bond the sealing member 309 with the substrate 400. The bonding layer 401 may be formed of a silicon oxide material and may bond with the sealing member 309 through fusion bonding.

The substrate 400 may provide structural support in the resonator. The substrate 400 may be formed of one or more of a semiconductor material (e.g., silicon), a ceramic material (e.g., alumina), a quartz material, a glass material, a metal material, an insulating material, etc.

In embodiments, the elements 308 and 309 may be unnecessary, and the bonding layer 401 may directly bond the substrate 400 with the dielectric member 306.

The dielectric layer 310 may directly contact the isolation member 302. One or more materials of the dielectric layer may be identical to one or more materials of one or more of the elements 306, 303, 302, 313, 316, 317, etc.

According to embodiments, in a resonator, a composite member with the piezoelectric 3122 layer may be positioned between the cavities 307 and 311, a common region of the cavities 307 and 311 at the composite member may be a polygon, and no two edges (i.e., no two straight sides) of the polygon may be parallel to each other. Advantageously, unwanted reflection and/or unwanted resonance of acoustic waves generated in the composite member may be minimized or substantially prevented.

Referring to FIG. 2, a method for manufacturing a resonator may include steps S201, S202, S203, S204, S205, S206, S207, and S208. Features (e.g., materials and/or structures) related to elements associated with the method may be identical to or analogous to features (e.g., materials and/or structures) of corresponding elements discussed above.

Figure 3:
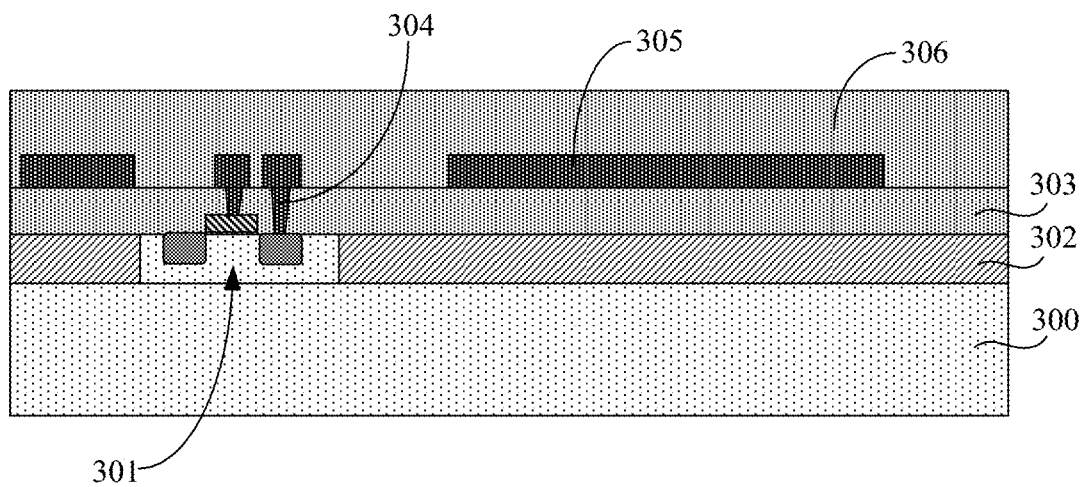
FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, and FIG. 27 show schematic diagrams (e.g., schematic cross-sectional views and schematic plan views/projections) that illustrate elements and/or structures formed in one or more methods for manufacturing one or more resonators in accordance with one or more embodiments.

Referring to FIG. 2 and FIG. 3, the step S201 may include the following steps: providing a substrate 300; providing a front-end device 301 and an isolation member 302 on the substrate 300; providing a dielectric layer 303 on the front-end device 301 and the isolation member 302; providing an electrical conductor 304 in the dielectric layer 303, wherein the electrical conductor 304 may directly contact the front-end device; providing an electrode 305 and a first interconnect structure on the dielectric layer 303, wherein the first interconnect structure may directly contact the electrical conductor 304; providing a dielectric layer 306 (or dielectric member 306) on the electrode 305, the dielectric layer 303, and the electrical conductor 304, wherein a portion of the dielectric layer 306 may electrically insulate the first interconnect structure from the electrode 305.

The substrate 300 may be formed of at least one of Si, Ge, SiGe, SiC, SiGeC, InAs, GaAs, InP, one or more other III/V compound semiconductors, etc. The substrate 300 may be or may include at least one of a silicon-on-insulator (SOI) substrate, a strained-silicon-on-insulator (SSOI) substrate, a strained-silicon-germanium-on-insulator (S—SiGeOI), a silicon-germanium-on-insulator (SiGeOI) substrate, a germanium-on-insulator (GeOI) substrate, etc. The substrate 300 may be or may include at least one of a ceramic substrate (e.g., an alumina substrate), a quartz substrate, a glass substrate, etc. The substrate 300 may support other elements.

The dielectric layer 303 may be formed using on or more deposition process, such as one or more of a such as one or more of a chemical vapor deposition (CVD) process, a physical vapor deposition (PVD) process, a thermal chemical vapor deposition (thermal CVD) process, a high density plasma (HDP) process, etc. The method may include determining a thickness of the dielectric layer 303 based on one or more dimensions of the resonator. Suitable materials for the dielectric layer 303 are described above.

The front-end device 301 may be or may include a transistor. The electrical conductor 304 may directly contact a source terminal, a drain terminal, or a gate terminal of the transistor.

The electrode 305 may be formed using one or more deposition processes, such as one or more of a low pressure chemical vapor deposition (LPCVD) process, a plasma-assisted chemical vapor deposition (PECVD) process, a metal organic chemical vapor deposition (MOCVD) process, an atomic layer deposition (ALD) process, an ultra-high vacuum chemical vapor deposition (UHVCVD) process, a rapid thermal chemical vapor deposition (RTCVD) process, a molecular beam epitaxy (MBE) process, etc. Suitable materials and thickness criteria for the electrode 305 are described above.

The dielectric layer 306 may be formed using on or more deposition process, such as one or more of a such as one or more of a chemical vapor deposition (CVD) process, a physical vapor deposition (PVD) process, a thermal chemical vapor deposition (thermal CVD) process, a high density plasma (HDP) process, etc. The method may include determining a thickness of the dielectric layer 306 based on one or more dimensions of the resonator. Suitable materials for the dielectric layer 306 are described above.

Figure 5:
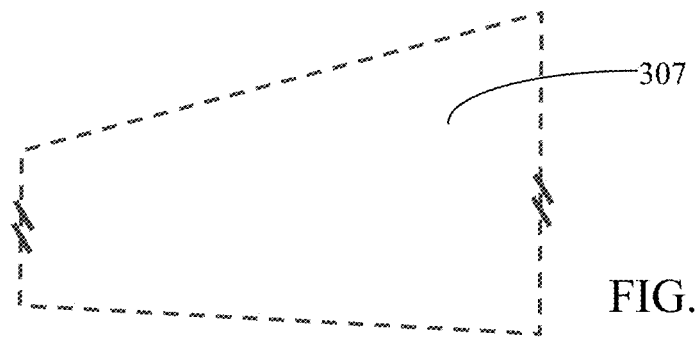
Figure 4:
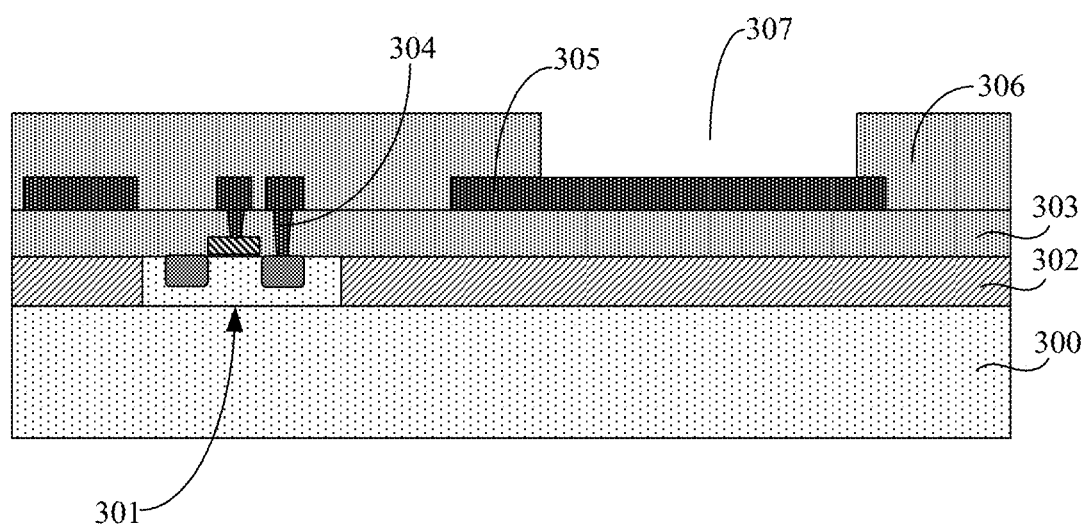

Referring to FIG. 2, FIG. 3, and FIG. 4, the step S202 may include forming a cavity 307 in the dielectric layer 306, wherein the cavity 307 may partially expose the electrode 305. Referring to FIG. 5, a plan view of the cavity 307 (or a projection of the cavity 307 in a direction perpendicular to the flat bottom side of the substrate 300) may have a polygon shape with a finite number of edges (i.e., a finite number of straight sides). The polygon shape may include at least one pair of parallel straight sides.

The step S202 may include the following steps: performing spin-coating, exposure, and development to form a patterned photoresist mask on the dielectric layer 306; partially removing, e.g., through an etching process, the dielectric layer 306 to form the cavity 307. The etching process may include a dry etching process and/or a wet etching process. The dry etching process may include at least one of a reactive ion etching (ME) process, an ion beam etching process, a plasma etching process, a laser cutting process, etc. The plasma etching process may utilize an etching gas that includes oxygen-based gases.

Figure 6:
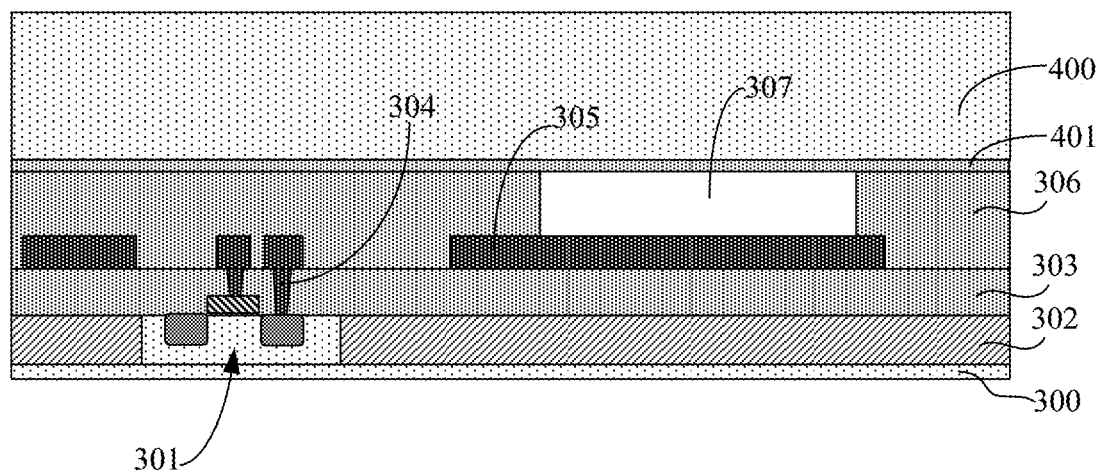
Figure 7:
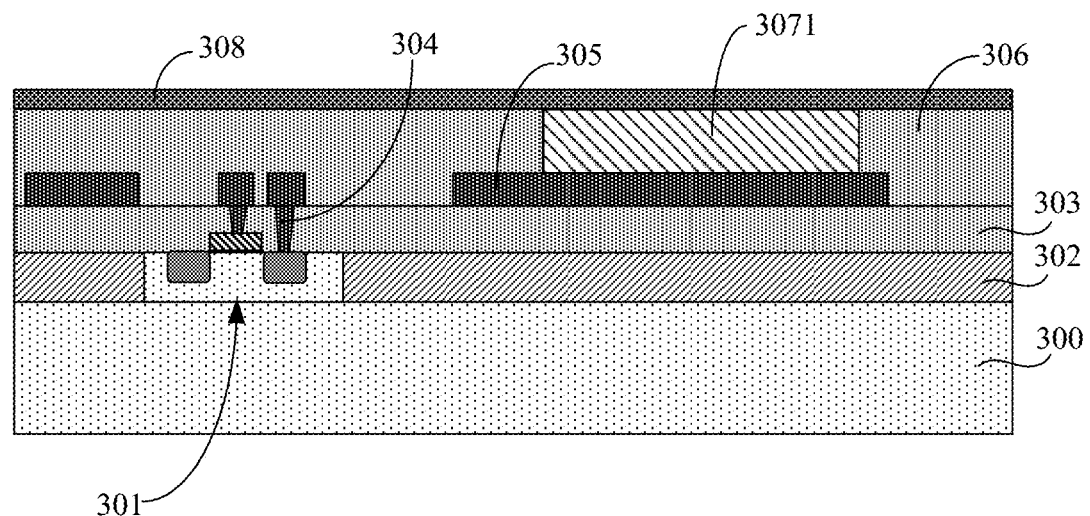
Figure 8:
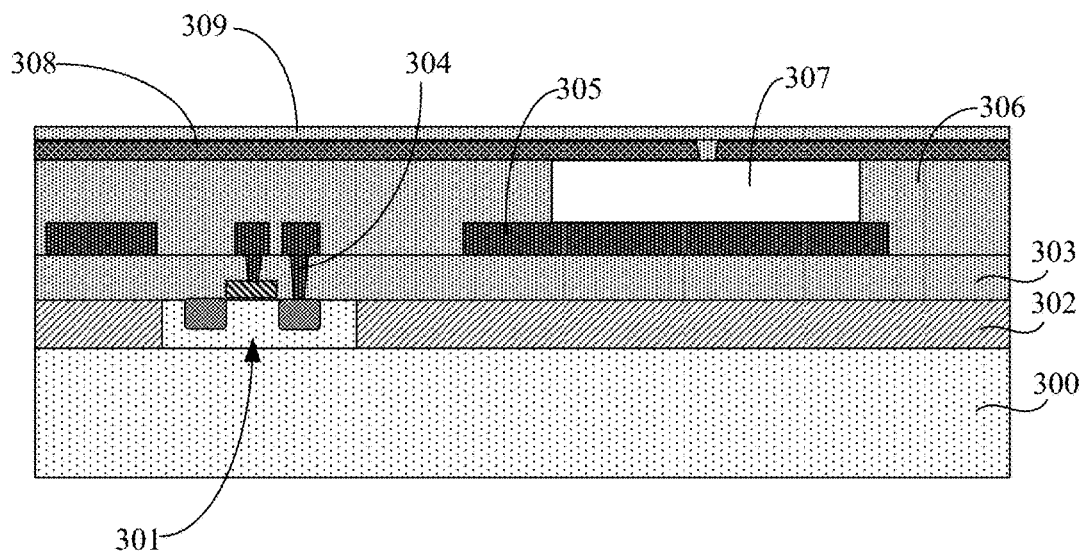

Referring to FIG. 2, FIG. 4, and FIG. 6, the step S203 may include bonding the dielectric layer 306 with a substrate 400 using a bonding layer 401. The bonding layer 401 may be positioned between the dielectric layer 306 and the substrate 400 and may seal the cavity 307.

Suitable materials of the substrate 400 and the bonding layer 401 are described above. The bonding layer 401 may be formed using one or more of a thermal oxidation process, a CVD process, a PVD process, etc. The bonding layer 401 may bond with the dielectric layer 306 through fusion bonding.

Referring to FIG. 2, FIG. 4, FIG. 7, FIG. 8, FIG. 9, the step S203 may include the following steps: providing a sacrificial layer 3071 inside the cavity 307; providing (e.g., using a CVD process and/or a PVD process) a cover member 308 on the dielectric layer 306 and the sacrificial layer 3071; forming a through hole set in the cover member 308, wherein the through hole set reaches (and partially exposes) the sacrificial layer 3071; removing the sacrificial layer 3071 through the through hole set; providing (e.g., using a CVD process and/or a PVD process) a sealing member 309 on the cover member 308, wherein the sealing member 309 seals (and fills) the through hole set; bonding the sealing member 309 with a substrate 400 using a bonding layer 401.

The step 203 may include the following steps: providing a sacrificial material set using one or more deposition process, e.g., one or more of a CVD process, a PVD process, etc.; performing a planarization process, e.g., a chemical-mechanical planarization (CMP) process, on the sacrificial material set to form the sacrificial layer 3071. The sacrificial layer 3071 may have sufficiently high etching selectivity relative to the dielectric layer 306, the electrode 305, and the cover member 308. In an embodiment, the dielectric layer 306 and the cover member 308 may be formed of silicon oxide, and the sacrificial layer 3071 may be formed of at least one of silicon nitride, silicon carbonitride, etc.

The step S203 may include the following steps: performing spin-coating, exposure, and development to form a patterned photoresist mask on the cover layer 308; partially removing, e.g., through an etching process, the cover layer 308 to form the through hole set of the cover layer 308.

The sacrificial layer 3071 may be removed using a wet etching process that has a substantially high etching selectivity ratio for the sacrificial layer 3071. In an embodiment, the sacrificial layer 3071 may be formed of silicon nitride, and an etchant that includes hot phosphoric acid may be utilized in the wet etching process.

The bonding layer 401 may bond with the sealing member 309 through fusion bonding.

The step S203 may include performing a thinning process on the substrate 300 to reduce a thickness of the substrate 300. The thinning process may include one or more of a CMP process, an etching process, etc.

Figure 9:
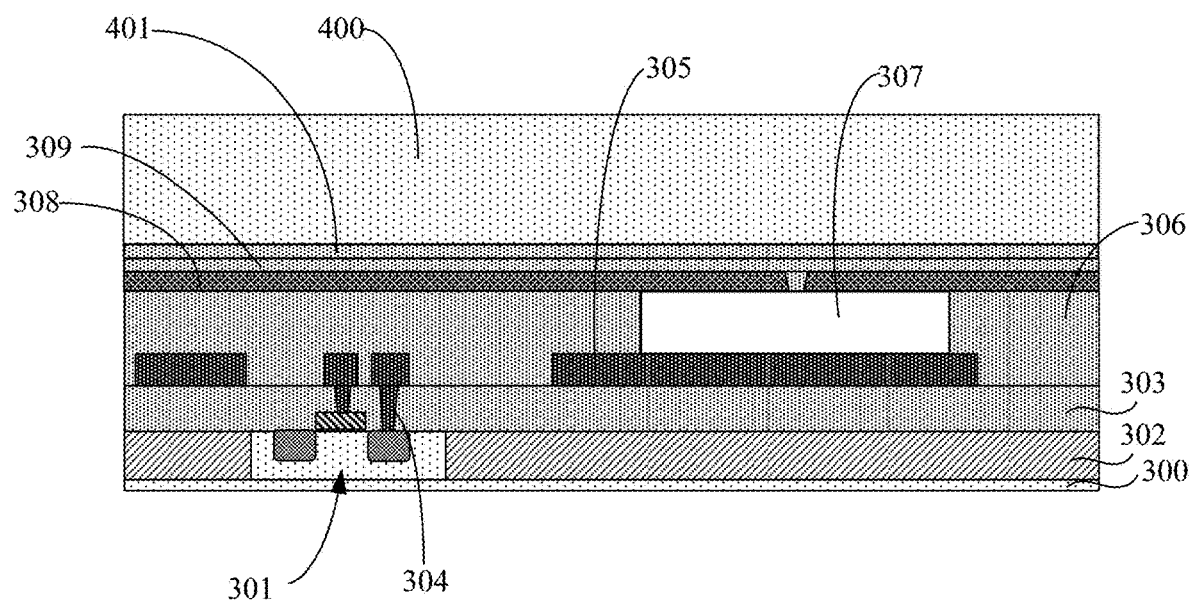
Figure 10:
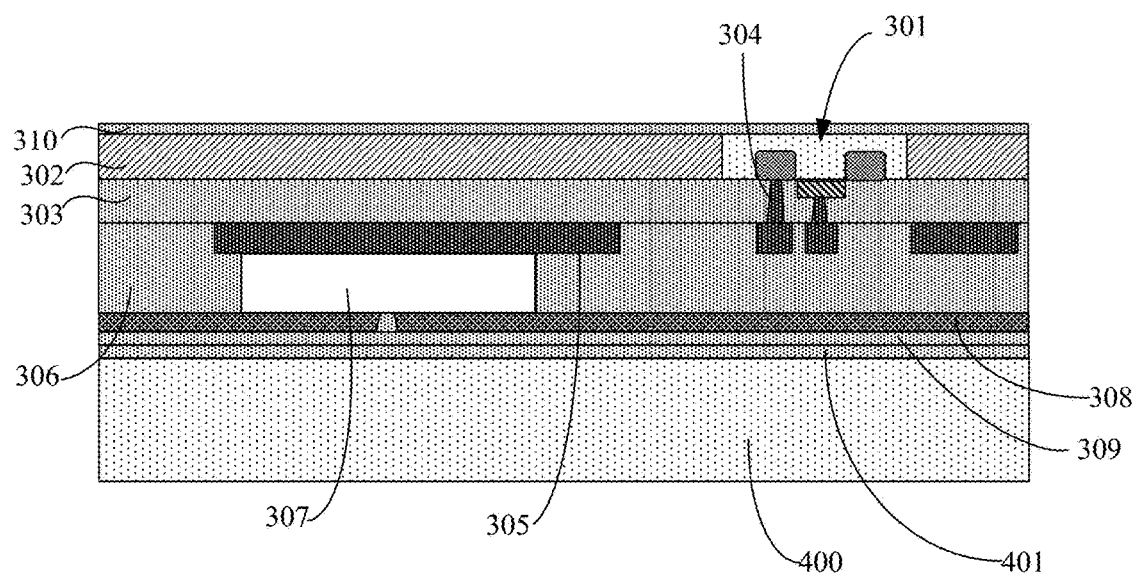

Referring to FIG. 2, FIG. 9, and FIG. 10, the step S204 may include the following steps: removing the substrate 300; providing a dielectric layer 310 on the isolation member 302 and the front-end device 301. The substrate may be removed using an etching process and/or a CMP process. The dielectric layer 310 may be formed using one or more deposition processes, such as one or more of a CVD process, a PVD process, a thermal CVD process, an HDP process, etc. Suitable materials for the dielectric layer 301 are described above.

Figure 12:
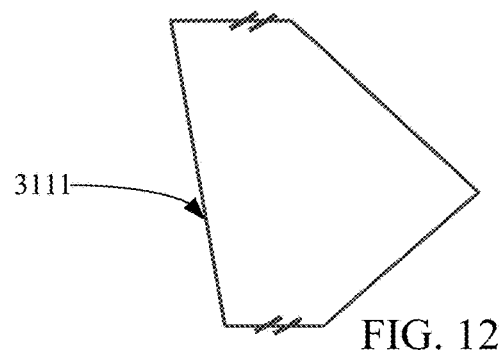
Figure 11:
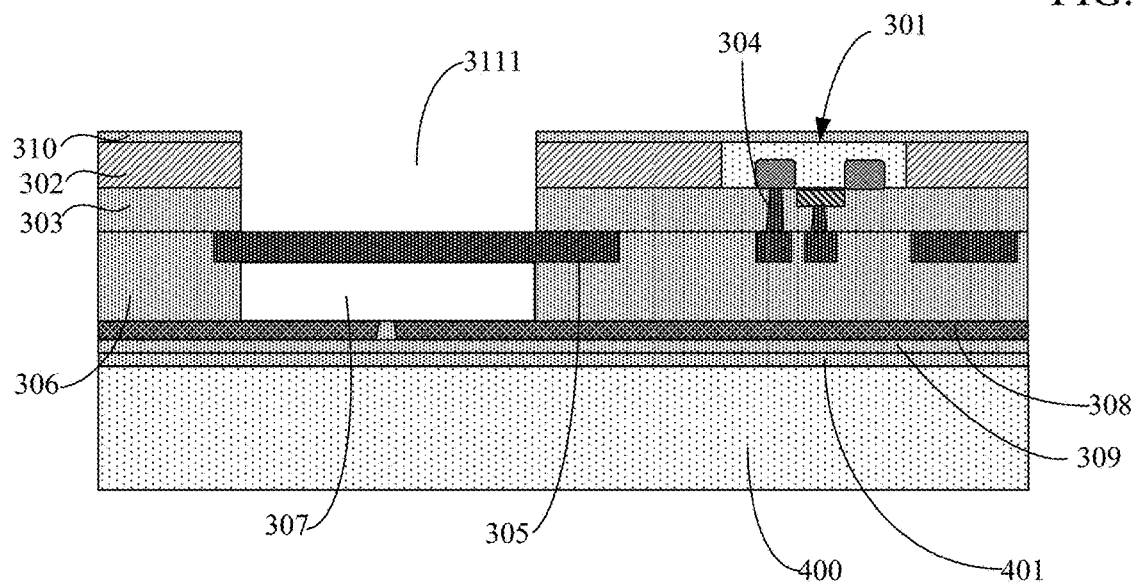

Referring to FIG. 2, FIG. 10, and FIG. 11, the step S205 may include etching the dielectric layer 310, the isolation member 302, and the dielectric layer 303 to form an opening 3111. The opening 3111 may expose the electrode 305. Referring to FIG. 12, a plan view of the opening 3111 (or a projection of the opening 3111 in a direction perpendicular to a flat bottom side of the substrate 400) may have a polygon shape with a finite number of edges (i.e., a finite number of straight sides). The polygon shape may include at least one pair of parallel straight sides.

The step S205 may include the following steps: performing spin-coating, exposure, and development to form a patterned photoresist mask on the dielectric layer 310; partially removing, e.g., through one or more etching processes, the dielectric layer 310, the isolation member 302, and the dielectric layer 303 to form the opening 3111. The one or more etching processes may include a dry etching process and/or a wet etching process. The dry etching process may include at least one of a reactive ion etching (ME) process, an ion beam etching process, a plasma etching process, a laser cutting process, etc. The plasma etching process may utilize an etching gas that includes oxygen-based gases. The opening 3111 may be positioned over the cavity 307.

Figure 13:
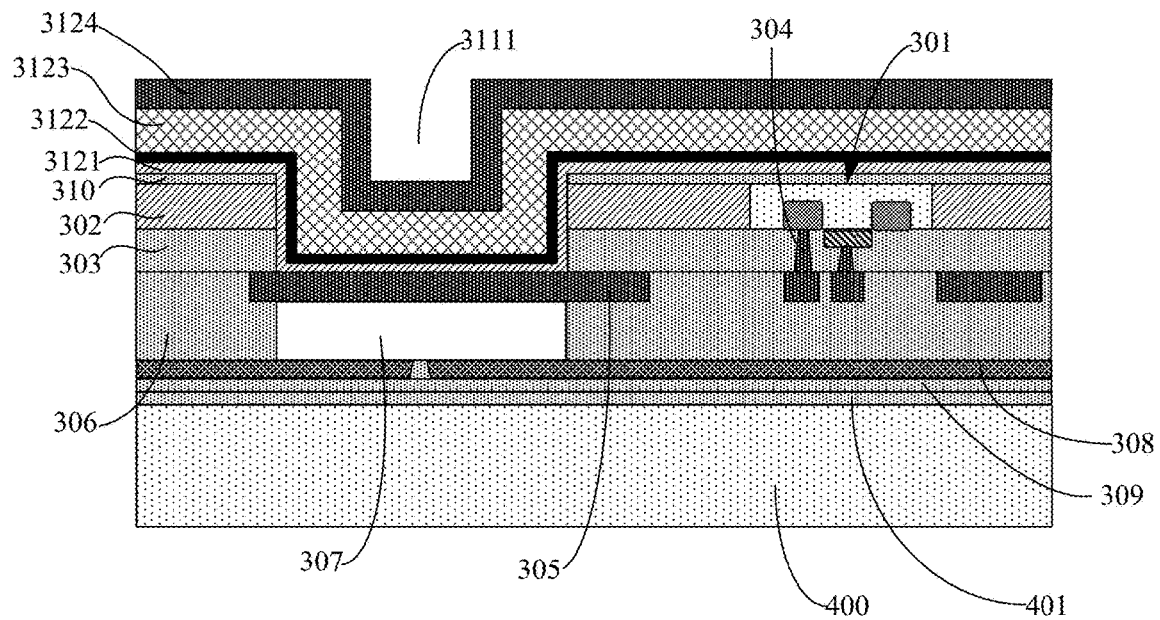

Referring to FIG. 2, FIG. 11, and FIG. 13, the step S206 may include the following steps: providing a piezoelectric layer 3123 on the dielectric layer 310 and in the opening 3111; providing an electrode 3124 on the piezoelectric layer 3123. Suitable materials for the piezoelectric layer 3123 and the electrode 3124 are described above. The piezoelectric layer 3123 may be formed using one or more of a vacuum evaporation deposition process, a sputtering process, a CVD process, a molecular beam epitaxy (MBE) process, etc. In an embodiment, the piezoelectric layer 3123 may be formed of AlN and may be formed using a reactive RF magnetron sputtering process: an aluminum metal set may be provided in a cathode in a process chamber, argon and nitrogen may be provided in the process chamber, and the reaction of the RF magnetron sputtering process may be performed at a temperature of about 200 degrees Celsius to form an AlN film. The electrode 3124 may be formed using one or more of a LPCVD process, a PECVD process, an MOCVD process, an ALD process, etc.

The step S206 may include the following steps before providing the piezoelectric layer 3123: providing an insulating layer 3121 on the dielectric layer 310 and in the opening 3111; providing an adhesive layer 3122 on the insulating layer 3121. Suitable materials for the insulating layer 3121 and the adhesive layer 3122 are described above. The insulating layer 3121 may be formed using one or more deposition processes, such as one or more of a CVD process, a PVD process, etc. The adhesive layer 3122 may be formed using one or more deposition processes, such as one or more of a LPCVD process, a PECVD process, an MOCVD process, an ALD process, etc.

The step S206 may include providing the following steps: providing an insulating layer on the piezoelectric layer 3123; providing the electrode 3124 on the insulating layer.

Some or all of the electrode 305, the insulating layer 3121, the adhesive layer 3122, the piezoelectric layer 3123, and the electrode 3124 may constitute a composite member of the resonator. The composite member may include one or more additional layers. The step S206 may include providing the one or more additional layers.

Portions of some or all of the insulating layer 3121, the adhesive layer 3122, the piezoelectric layer 3123, and the electrode 3124 may be formed on the sidewalls of the opening 3111 without completely filling the opening 3111. A plan view of the unfilled portion of the opening 3111 (or a projection of the unfilled portion of the opening 3111 in a direction perpendicular to a flat bottom side of the substrate 400) may have a polygon shape similar to the polygon shape of the plan view of the opening illustrated in FIG. 12 with at least one pair of parallel edges.

Figure 14:
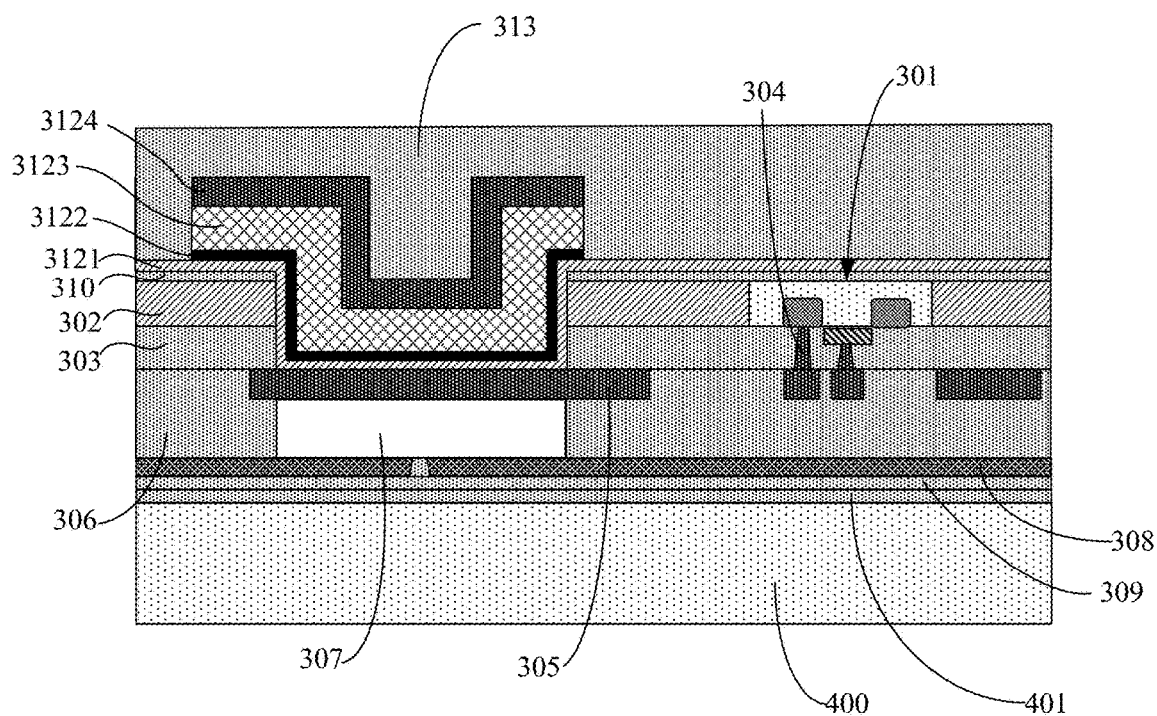
Figure 23:
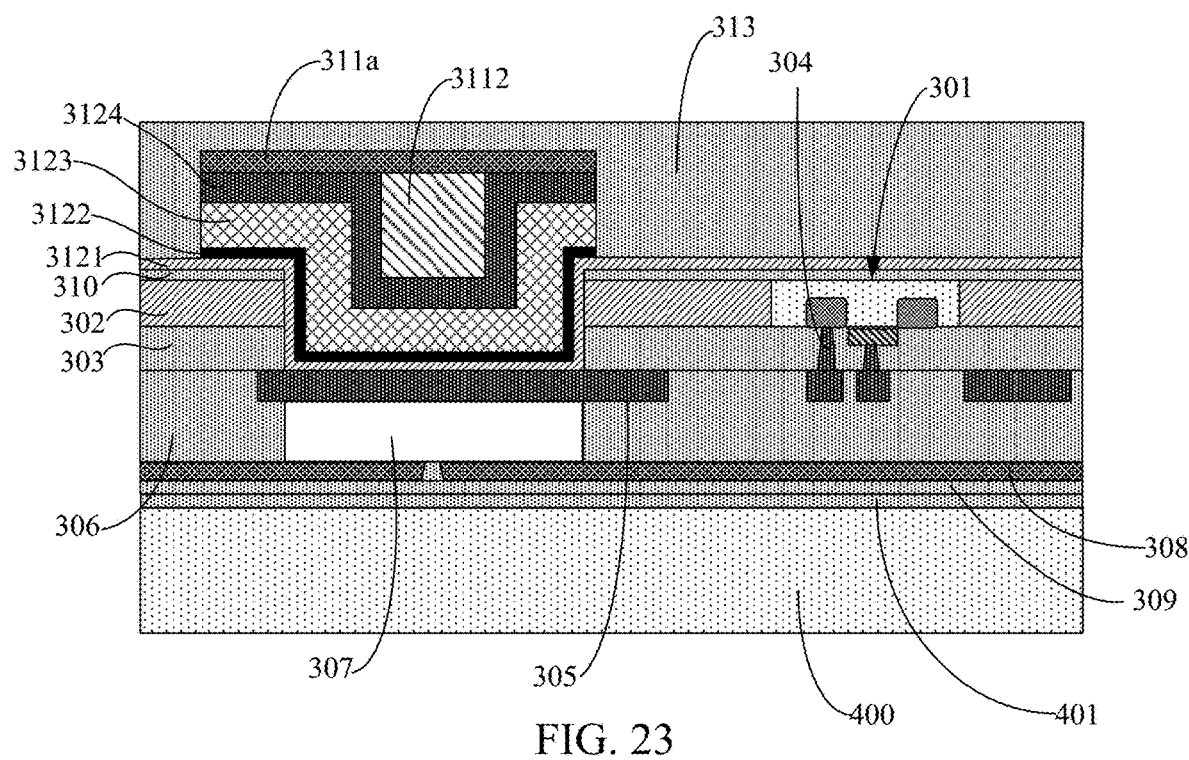

Referring to FIG. 2, FIG. 13, and FIG. 14 and/or referring to FIG. 2, FIG. 13, and FIG. 23, the step S207 may include the following steps: partially removing portions of the electrode 3124 and the piezoelectric layer 3123 that are positioned outside the opening 3111.

The step S207 may include the following steps: performing spin-coating, exposure, and development to form a patterned photoresist mask on the electrode 3124; partially removing, e.g., through one or more etching processes, the electrode 3124 and the piezoelectric layer 3123. The etching process may include a dry etching process and/or a wet etching process. The dry etching process may include at least one of a reactive ion etching (RIE) process, an ion beam etching process, a plasma etching process, a laser cutting process, etc. The one or more etching processes may utilize one or more etching gases that include one or more of $Cl_2$, $BCl_3$, Ar, $N_2$, $CHF_3$, $C_2H_4$, etc., wherein $Cl_2$ may be a primary etching gas.

Referring to FIG. 2, FIG. 13 and FIG. 14, FIG. 15, FIG. 16, FIG. 17, FIG. 18, and FIG. 19, the step S208 may include providing a cavity 311 in the opening 3111; sealing the cavity 311.

Referring to FIG. 13 and FIG. 14, the step S208 may include providing a dielectric layer 313 (or dielectric member 313) on the electrode 3124 (and on the insulating layer 3121). The dielectric layer 313 may cover the electrode 3124 and may fill the opening 3111. Suitable materials for the dielectric layer 313 are described above. The dielectric layer 313 may be formed using one or more of a CVD process, a PVD process, a thermal CVD process, an HDP process, etc.

Figure 15:
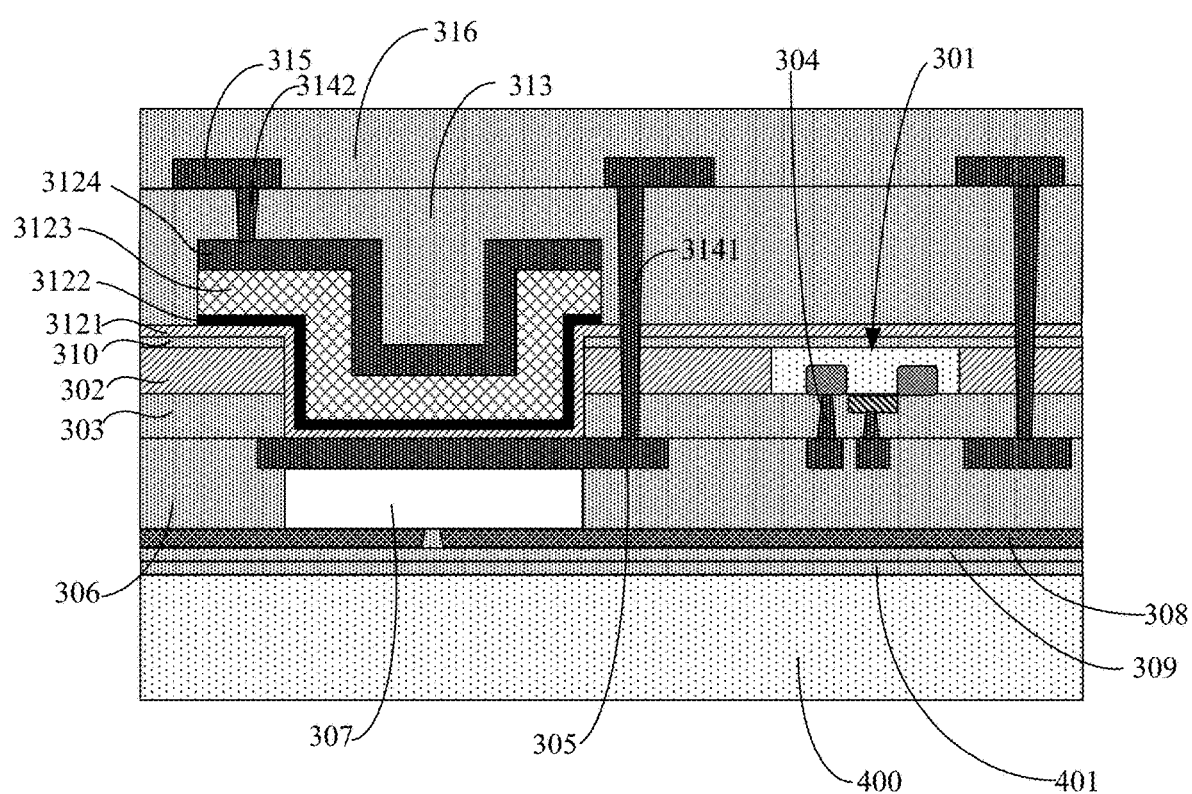

Referring to FIG. 14 and FIG. 15, the step S208 may include the following steps: providing an electrical conductor 3141 and an electrical conductor 3142 in the dielectric layer 313; providing an interconnect structure 315 on the dielectric layer 313; providing a dielectric layer 316 on the dielectric layer 313 and the interconnect structure 315. The electrical conductor 3141 and the electrical conductor 3142 may respectively directly contact the electrode 305 and the electrode 3124. The interconnect structure 315 may be electrically connected through the electrical conductor 3142 to the electrode 3124 and may be electrically insulated from the electrical conductor 3141 by the dielectric layers 316 and 313. Suitable materials for the dielectric layer 316 are described above. The dielectric layer 316 may be formed using one or more of a CVD process, a PVD process, a thermal CVD process, an HDP process, etc.

Figure 16:
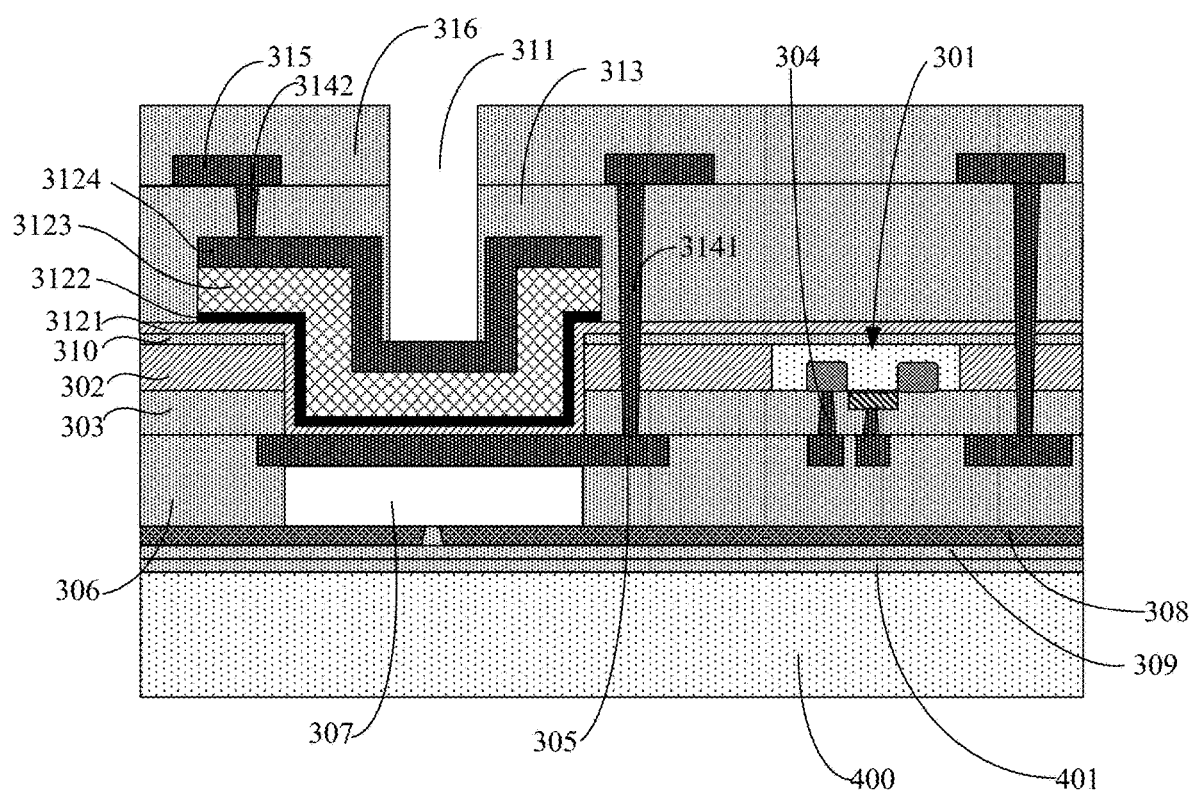
Figure 17:
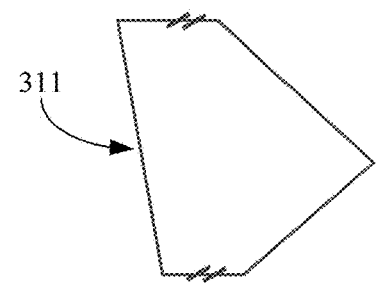

Referring to FIG. 15 and FIG. 16, the step S208 may include etching the dielectric layer 316 and the dielectric layer 313 to form a cavity 311. The cavity 311 may partially expose the electrode 3124. Referring to FIG. 17, a plan view of the cavity 311 (or a projection of the cavity 311 in the direction perpendicular to the flat bottom side of the substrate 400) may have a polygon shape with a finite number of edges (i.e., a finite number of straight sides). The polygon shape may include at least one pair of parallel straight sides.

The step S208 may include the following steps: performing spin-coating, exposure, and development to form a patterned photoresist mask on the dielectric layer 316; partially removing, e.g., through one or more etching processes, the dielectric layer 316 and the dielectric layer 313 to form the cavity 311. The one or more etching processes may include a dry etching process and/or a wet etching process. The dry etching process may include at least one of a reactive ion etching (RIE) process, an ion beam etching process, a plasma etching process, a laser cutting process, etc. The plasma etching process may utilize an etching gas that includes oxygen-based gases. The cavity 311 may be positioned over the cavity 307. Features and advantages of the cavity 311 and the cavity 307 are described above.

Figure 18:
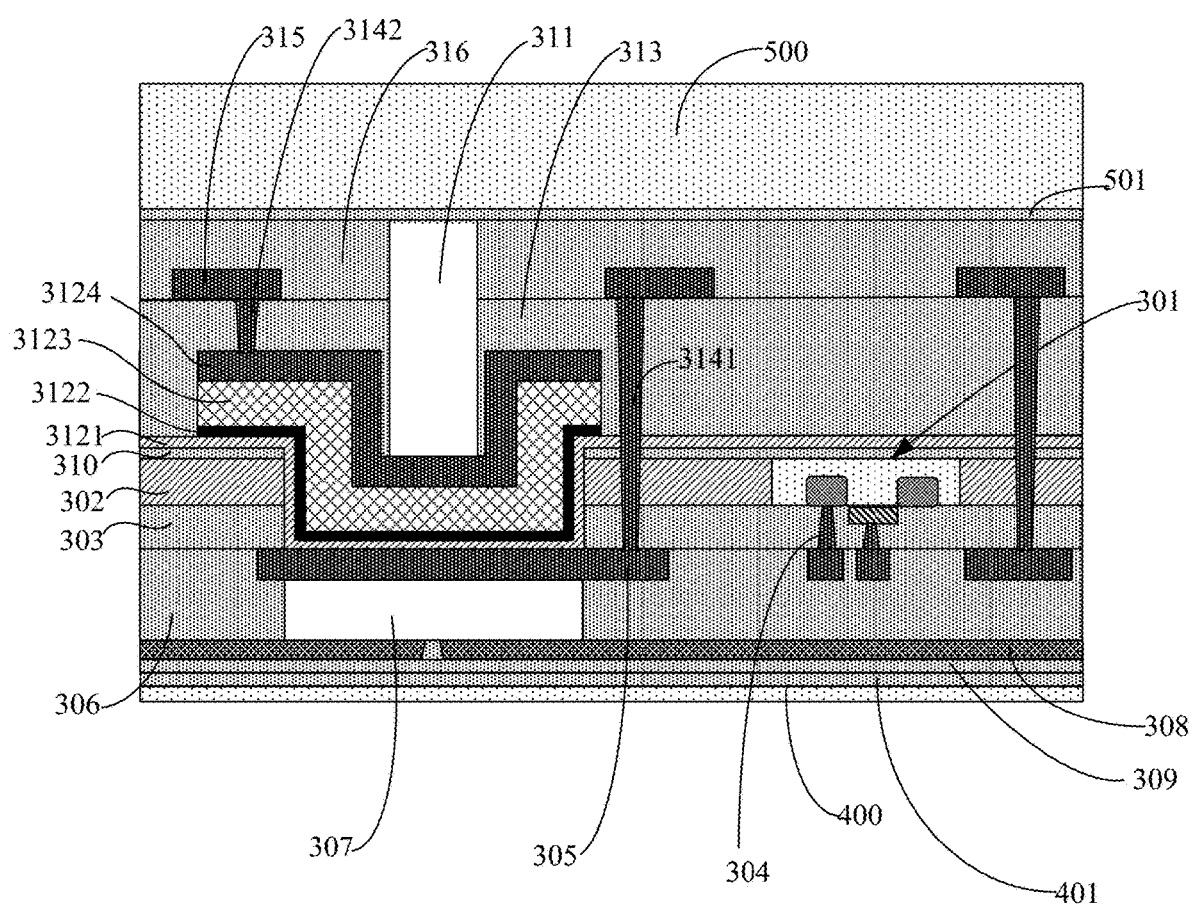

Referring to FIG. 16 and FIG. 18, the step S208 may include the following steps: providing a bonding layer 501 on the dielectric layer 316; providing a substrate 500 on the bonding layer 501. The bonding layer 501 may seal the cavity 311 and may bond the substrate 500 with the dielectric layer 316. Suitable materials for the bonding layer 501 and the substrate 500 are described above. The bonding layer 501 may be formed using one or more of a thermal oxidation process, a CVD process, a PVD process, etc. and may bond with the dielectric layer 316 through fusion bonding.

Referring to FIG. 16 and FIG. 18, the step S208 may include performing a thinning process on the substrate 400 to reduce a thickness of the substrate 400. The thinning process may include at least one of an etching process, a CMP process, etc.

Referring to FIG. 18 and FIG. 19, the step S208 may include removing the substrate 400. The substrate 400 may be removed using at least one of an etching process, a CMP process, etc.

Figures 20, 21:
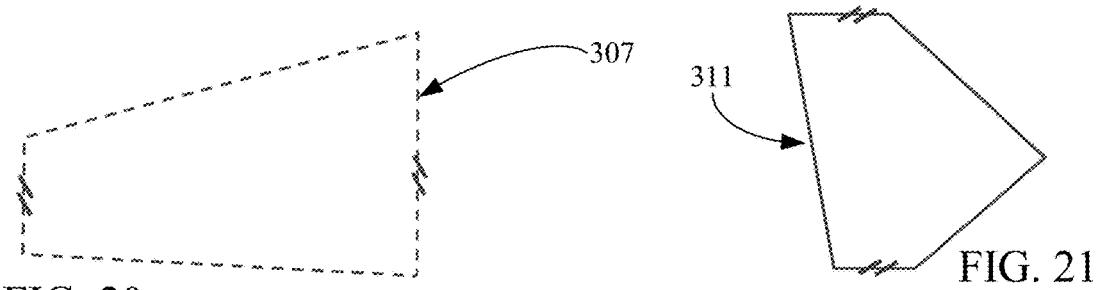

Referring to FIG. 20, a plan view of the cavity 307 (or a projection of the cavity 307 in a direction perpendicular to a flat bottom side of the substrate 500) may have first polygon shape with a finite number of edges (i.e., a finite number of straight sides). The first polygon shape may include at least a first pair of parallel straight sides. Referring to FIG. 21, a plan view of the cavity 311 (or a projection of the cavity 311 in the direction perpendicular to the flat bottom side of the substrate 500) may have a second polygon shape with a finite number of edges (i.e., a finite number of straight sides). The second polygon shape may include at least a second pair of parallel straight sides. Features and advantages related to the cavities 307 and 311 may be analogous to or identical to features and advantages related to the cavities 103 and 104 discussed with reference to FIG. 1A and FIG. 1B.

Referring to FIG. 2, FIG. 13, FIG. 22, FIG. 23, FIG. 24, and FIG. 25, the step S208 may include providing a cavity 311 in the opening 3111; sealing the cavity 311.

Figure 22:
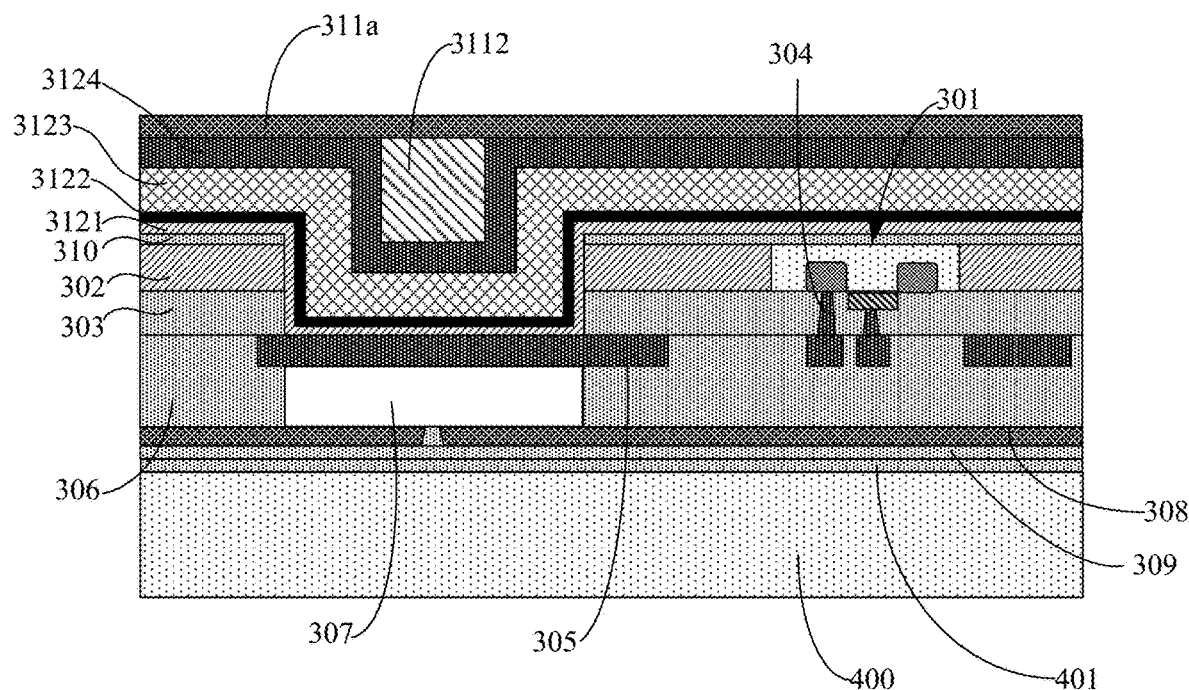

Referring to FIG. 13 and FIG. 22, the step S208 may include the following steps: providing (e.g., using at least one of a CVD process, a PVD process, etc.) a sacrificial material set inside the unfilled portion of the opening 3111 and on the electrode 3124; planarizing (e.g., using a CMP process) the sacrificial material set to form a sacrificial member 3112 such that a top surface of the sacrificial member 3112 is substantially coplanar with a top surface of the electrode 3124; providing (e.g., using a CVD process) a cover member 311a on the sacrificial member 3112 and on the electrode 3124. The sacrificial member 3112 may fill the previously unfilled portion of the opening 3111 and may directly contact more than five flat sides (including the bottom side) of the electrode 3124.

The sacrificial member 3112 may have a substantially high etching selectivity ratio relative to the cover member 311a and the subsequently formed dielectric layers 313 and 316. Suitable materials for the cover member 311a, the dielectric layer 313, and the dielectric layer 316 are described above. In an embodiment, the cover member 311a, the dielectric layer 313, and the dielectric layer 316 may be formed of a silicon oxide material, and the sacrificial member 3112 may be formed of at least one of silicon nitride, silicon carbonitride, etc.

Referring to FIG. 22 and FIG. 23, the step S208 may include the following steps: partially removing portions of the electrode 3124 and the piezoelectric layer 3123 that are positioned outside the opening 3111; providing a dielectric layer 313 (or dielectric member 313) on the cover member 311a and on the insulating layer 3121. The dielectric layer 313 may cover the cover member 311a, the electrode 3124, the piezoelectric layer 3123, the adhesive layer 3122, and the insulating layer 3121.

Figure 24:
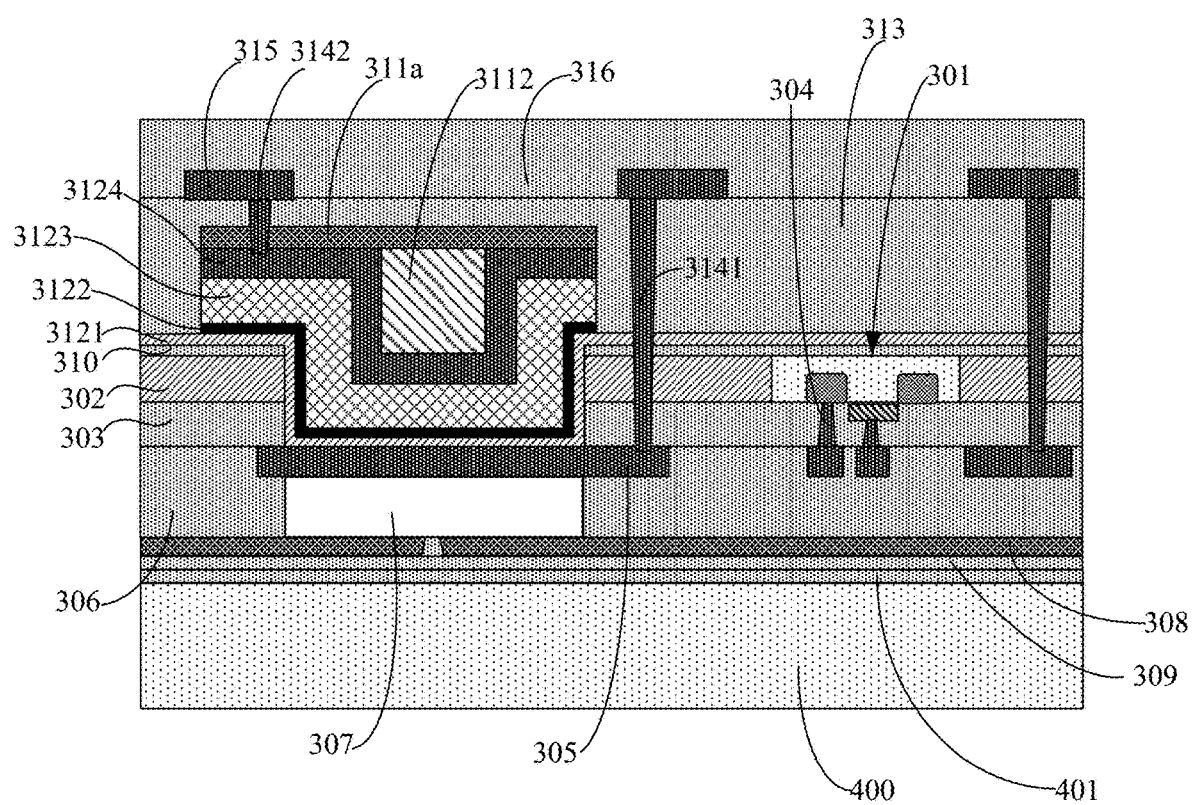

Referring to FIG. 23 and FIG. 24, the step S208 may include the following steps: providing an electrical conductor 3141 and an electrical conductor 3142 in the dielectric layer 313; providing an interconnect structure 315 on the dielectric layer 313; providing a dielectric layer 316 on the dielectric layer 313 and the interconnect structure 315. The electrical conductor 3141 and the electrical conductor 3142 may respectively directly contact the electrode 305 and the electrode 3124. The interconnect structure 315 may be electrically connected through the electrical conductor 3142 to the electrode 3124 and may be electrically insulated from the electrical conductor 3141 by the dielectric layers 316 and 313.

Referring to FIG. 24 and FIG. 25, the step S208 may include the following steps: forming a through hole set that includes one or more through holes, extends through the dielectric layer 316, the dielectric layer 313, and the cover member 311a, exposes the sacrificial member 3112; removing the sacrificial member 3112 through the through hole set; providing a sealing member 317 on the dielectric layer 316 to seal the through hole set.

The step S208 may include the following steps: performing spin-coating, exposure, and development to form a patterned photoresist mask on the dielectric layer 316; partially removing, e.g., through one or more etching processes, the dielectric layer 316, the dielectric layer 313, and the cover member 311a to form the through hole set. The one or more etching processes may include a dry etching process and/or a wet etching process. The dry etching process may include at least one of a reactive ion etching (ME) process, an ion beam etching process, a plasma etching process, a laser cutting process, etc. The plasma etching process may utilize an etching gas that includes oxygen-based gases.

The sacrificial member 3112 may be removed using a wet etching process that has a substantially high etching selectivity ratio for the sacrificial member 3112. In an embodiment, the sacrificial member 3112 may be formed of silicon nitride, and an etchant that includes hot phosphoric acid may be utilized in the wet etching process.

Suitable materials for the sealing member 317 are described above. The sealing member 317 may be formed using one or more of a CVD process, a PVD process, etc.

Referring to FIG. 26, a plan view of the cavity 307 (or a projection of the cavity 307 in a direction perpendicular to a flat bottom side of the substrate 500) may have first polygon shape with a finite number of edges (i.e., a finite number of straight sides). The first polygon shape may include at least a first pair of parallel straight sides. Referring to FIG. 27, a plan view of the cavity 311 (or a projection of the cavity 311 in the direction perpendicular to the flat bottom side of the substrate 500) may have a second polygon shape with a finite number of edges (i.e., a finite number of straight sides). The second polygon shape may include at least a second pair of parallel straight sides. Features and advantages related to the cavities 307 and 311 may be analogous to or identical to features and advantages related to the cavities 103 and 104 discussed with reference to FIG. 1A and FIG. 1B.

According to embodiments, sidewalls of the cavity 307 may be defined by the dielectric material of the dielectric layer 306, and sidewalls of the cavity 311 may be defined by the conductive material or semiconductor material of the electrode 3124, which is different from the dielectric material of the dielectric layer 306. Advantageously, unwanted reflection and/or unwanted resonance of acoustic waves generated in the composite member may be minimized or substantially prevented.

An embodiment may be related to an electronic device that includes an electronic component and a resonator. The resonator may be electrically connected to the electronic component. The resonator may have one or more of the above-discussed features.

According to embodiments, in a resonator, a composite member that includes a piezoelectric layer without through holes or interruptions may substantially (and/or completely) separate the two cavities and may substantially (and/or completely) seal the two cavities. Advantageously, satisfactory performance of the resonator (and an associated electronic device) may be attained.

According to embodiments, in a resonator, a composite member with a piezoelectric layer is positioned between two cavities, a common region of the two cavities at the composite member may be a polygon, and no two edges (i.e., no two straight sides) of the polygon may be parallel to each other. Advantageously, unwanted reflection and/or unwanted resonance of acoustic waves generated in the composite member may be minimized or substantially prevented, and satisfactory performance of the resonator may be attained.

According to embodiments, in a resonator, a composite member with a piezoelectric layer is positioned between a first cavity and a second cavity, sidewalls of the first cavity may be defined by a first material (e.g., a dielectric material), and sidewalls of the second cavity may be defined by a second material (e.g., a conductive material or a semiconductor material) different from the first material. Advantageously, unwanted reflection and/or unwanted resonance of acoustic waves generated in the composite member may be minimized or substantially prevented, and satisfactory performance of the resonator may be attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A resonator comprising:
a first dielectric member, which comprises a first cavity;
a second dielectric member; and
a composite member, which comprises a piezoelectric layer and overlaps at least one of the first dielectric member and the second dielectric member, wherein at least one of the second dielectric member and the composite member comprises a second cavity, wherein the piezoelectric layer is positioned between the first cavity and the second cavity, wherein a projection of the first cavity in a direction perpendicular to a flat side of the first dielectric member and a projection of the second cavity in the direction intersect each other to form a polygon, and wherein no two edges of the polygon are parallel to each other.

2. The resonator of claim 1, wherein the projection of the first cavity comprises a first side, a second side, a third side, and a fourth side, wherein the first side is parallel to the second side, wherein two ends of the first side respectively directly contact an end of the third side and an end of the fourth side, wherein the projection of the second cavity comprises a fifth side, and wherein the fifth side intersects both the third side and the fourth side.

3. The resonator of claim 2, wherein the projection of the second cavity comprises a sixth side and a seventh side, wherein the sixth side is parallel to the seventh side, and wherein two ends of the fifth side respectively directly contact an end of the sixth side and an end of the seventh side.

4. A resonator comprising:
a first dielectric member, which comprises a first cavity,
a second dielectric member; and
a composite member, which comprises a piezoelectric layer and overlaps at least one of the first dielectric member and the second dielectric member,
wherein a first orthographic projection of the first cavity on a surface of the composite member adjacent to the first cavity comprises a first side, a second side, a third side, and a fourth side,
wherein the first side is parallel to the second side,
wherein two ends of the first side respectively directly contact an end of the third side directly and an end of the fourth side, and wherein the third side is not parallel to the fourth side; and
wherein at least one of the second dielectric member and the composite member comprises a second cavity, wherein the piezoelectric layer is positioned between the first cavity and the second cavity.

5. The resonator of claim 4, wherein a section of the composite member extends from a first sidewall of the first cavity to a second sidewall of the first cavity and comprises no through holes, wherein the first sidewall of the first cavity and the second sidewall of the first cavity respectively correspond to the first side and the second side, configured opposite to each other.

6. The resonator of claim 4, wherein a second orthographic projection of the second cavity on the surface of the composite member adjacent to the first cavity comprises a fifth side, a sixth side, a seventh side, and an eighth side, wherein the fifth side is parallel to the sixth side, wherein an end of the seventh side directly contacts an end of the fifth side, and wherein the seventh side is not parallel to the eighth side.

7. The resonator of claim 4, wherein a second orthographic projection of the second cavity on the surface of the composite member adjacent to the first cavity comprises a fifth side, a sixth side, a seventh side, and an eighth side, and wherein none of the first side, the second side, the third side, and the fourth side is parallel to any of three of the fifth side, the sixth side, the seventh side, and the eighth side.

8. The resonator of claim 4, wherein a second orthographic projection of the second cavity on the surface of the composite member adjacent to the first cavity comprises a fifth side, a sixth side, a seventh side, an eighth side, and a ninth side, wherein the fifth side is parallel to the sixth side, wherein a first end of the seventh side directly contacts an end of the fifth side, wherein a second end of the seventh side directly contacts a first end of the eighth side, and wherein a second end of the eighth side directly contacts an end of the sixth side, and wherein the ninth side connects the fifth side with the sixth side.

9. The resonator of claim 8, wherein the first and second orthographic projections overlap with each other on the surface of the composite member adjacent to the first cavity, and the first side intersects both the seventh side and the eighth side.

10. The resonator of claim 9, wherein, in the overlapped first and second orthographic projections on the surface of the composite member adjacent to the first cavity, the third side intersects the seventh side.

11. The resonator of claim 10, wherein, in the overlapped first and second orthographic projections on the surface of the composite member adjacent to the first cavity, the fourth intersects the eighth side.

12. The resonator of claim 11, wherein, in the overlapped first and second orthographic projections on the surface of the composite member adjacent to the first cavity, the ninth side intersects both the third side and the fourth side.

13. The resonator of claim 4, wherein the composite member comprises an electrode, which overlaps the piezoelectric layer.

14. The resonator of claim 13, wherein the second cavity is positioned between two opposite portions of the electrode, and wherein the two opposite portions of the electrode define two straight sides of a second orthographic projection of the second cavity on the surface of the composite member adjacent to the first cavity.

15. The resonator of claim 14, wherein the two opposite portions of the electrode are positioned between two opposite portions of the piezoelectric layer and respectively directly contact the two opposite portions of the piezoelectric layer.

16. The resonator of claim 15, further comprising an adhesive layer, wherein the two opposite portions of the piezoelectric layer are positioned between two opposite portions of the adhesive layer and respectively directly contact the two opposite portions of the adhesive layer.

17. The resonator of claim 16, further comprising an insulating layer, which is different from each of the first dielectric member and the second dielectric member, and wherein the two opposite portions of the adhesive layer are positioned between two opposite portions of the insulating layer and respectively directly contact the two opposite portions of the insulating layer.

18. The resonator of claim 14, further comprising a cover member, which covers the second cavity, directly contacts the two opposite portions of the electrode, and is positioned between the electrode and a portion of the second dielectric member.

19. The resonator of claim 14, wherein a flat portion of the electrode is positioned between the second cavity and the piezoelectric layer, is positioned between the two opposite portions of the electrode, and is oriented at an angle between 0 degree and 180 degrees with respect to at least one of the two opposite portions of the electrode.

20. A method for manufacturing a resonator, the method comprising:
   providing a first dielectric member, which comprises a first cavity;
   providing a second dielectric member; and
   providing a composite member, which comprises a piezoelectric layer and overlaps at least one of the first dielectric member and the second dielectric member, wherein at least one of the second dielectric member and the composite member comprises a second cavity, wherein the piezoelectric layer is positioned between the first cavity and the second cavity, wherein a projection of the first cavity in a direction perpendicular to a flat side of the first dielectric member and a projection of the second cavity in the direction intersect each other to form a polygon, and wherein no two edges of the polygon are parallel to each other.

* * * * *